US006522064B2

(12) United States Patent
Mitsutake et al.

(10) Patent No.: US 6,522,064 B2
(45) **Date of Patent: *Feb. 18, 2003**

(54) IMAGE FORMING APPARATUS AND METHOD OF MANUFACTURE THE SAME

(75) Inventors: Hideaki Mitsutake, Yokohama; Masahiro Fushimi, Zama, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,081

(22) Filed: Mar. 26, 1998

(65) Prior Publication Data

US 2001/0013603 A1 Aug. 16, 2001

(30) Foreign Application Priority Data

Mar. 28, 1997 (JP) ........................................ 9-078427
Mar. 17, 1998 (JP) ........................................ 10-066810

(51) Int. Cl.[7] ........................ H01L 29/06; H01J 1/96

(52) U.S. Cl. ..................... 313/500; 257/10; 257/701; 313/336

(58) Field of Search ................ 257/10, 701; 313/500, 313/336

(56) References Cited

U.S. PATENT DOCUMENTS

| | | | | |
|---|---|---|---|---|
| 4,904,895 A | | 2/1990 | Tsukamoto et al. | 313/336 |
| 5,066,883 A | | 11/1991 | Yoshioka et al. | 313/309 |
| 5,760,538 A | | 6/1998 | Mitsutake et al. | 313/422 |
| 5,789,857 A | | 8/1998 | Yamaura et al. | 313/495 |
| 5,914,491 A | * | 6/1999 | Salokatve | |
| 5,936,343 A | | 8/1999 | Fushimi et al. | 313/495 |

FOREIGN PATENT DOCUMENTS

| | | | |
|---|---|---|---|
| EP | 0690472 | A1 | 1/1996 |
| EP | 0739029 | A2 | 10/1996 |
| JP | 61-124031 | | 6/1986 |
| JP | 63-202819 | | 8/1988 |
| JP | 64-31332 | | 2/1989 |
| JP | 2-257551 | | 10/1990 |
| JP | 3-55738 | | 3/1991 |
| JP | 4-28137 | | 1/1992 |
| JP | 5-190077 | | 7/1993 |
| JP | 8-148102 | | 6/1996 |
| JP | 8-180821 | | 7/1996 |
| JP | 8-222156 | | 8/1996 |
| JP | 9-7532 | | 1/1997 |
| WO | WO 94-18694 | A | 8/1994 |
| WO | WO 96-30926 | A | 10/1996 |

OTHER PUBLICATIONS

Araki, H., et al., "Electroforming and Electron Emission of Carbon Thin Films," *Vacuum*, vol. 26, No. 1 (1983).

Dittmer, G., "Electrical Conduction and Electron Emission of Discontinuous Thin Films," *Thin Solid Films*, vol. 9 (1972).

Elinson, M.I., et al., "The Emission of Hot Electrons and the Field Emission of Electrons from Tin Oxide," *Radio Eng. Electronic Physics*, vol. 10, (1965).

(List continued on next page.)

*Primary Examiner*—Jerome Jackson
(74) *Attorney, Agent, or Firm*—Fitzpatrick, Cella, Harper & Scinto

(57) ABSTRACT

An image forming apparatus includes an electron source having a substrate on which a plurality of electron emitting devices are arranged, and a face plate provided with striped fluorescent substances for emitting light of different colors and serving to form a color image upon irradiation of electrons by the electron source. Rectangular spacers are arranged between the substrate and the face plate, and are fixed to the substrate and contact the face plate. A longitudinal direction of the spacers crosses a longitudinal direction of the striped fluorescent substances at a substantially right angle.

32 Claims, 17 Drawing Sheets

OTHER PUBLICATIONS

Dyke, W.P., et al., "Field Emission," *Advances in Electronics and Electron Physics*, vol. 8, (1956).

Hartwell, M, et al., "Strong Electron Emission from Patterned Tin–Indium Oxide Thin Films," *IEDM Trans. ED Conf.*, (1975).

Mead, C.A., "Operation of Tunnel–Emission Devices", *Journ. of Appl. Physics*, vol. 32, No. 4, (1961).

Meyer, R., "Recent Development on "Microtips" Display at Leti," *Tech. Digest of IVMC* 91, *Nagahama*, (1991).

Spindt, C.A., et al., Physical Properties of Thin–Film Field Emission Cathodes with Molybdenum Cones, *Journ. of Appl. Physics*, vol. 47, No. 12, (1976).

* cited by examiner

R : RED FLUORESCENT SUBSTRATE
G : GREEN FLUORESCENT SUBSTRATE
B : BLUE FLUORESCENT SUBSTRATE

R : RED FLUORESCENT SUBSTRATE
G : GREEN FLUORESCENT SUBSTRATE
B : BLUE FLUORESCENT SUBSTRATE

IMAGE FORMING APPARATUS AND METHOD OF MANUFACTURE THE SAME

BACKGROUND OF THE INVENTION

1. Field of the Invention

The present invention relates to an image forming apparatus having an electron source and fluorescent substances.

2. Description of the Related Art

Flat display apparatuses are thin and lightweight. Attention is therefore being given to them as apparatuses replacing CRT type display apparatuses. A display apparatus using a combination of an electron-emitting device and a fluorescent substance which emits light upon reception of an electron beam, in particular, is expected to have better characteristics than display apparatuses based on other conventional schemes. For example, in comparison with recent popular liquid crystal display apparatuses, the above display apparatus is superior in that it does not require a backlight because it is of a self-emission type and that it has a wide view angle.

Conventionally, two types of devices, namely hot and cold cathode devices, are known as electron-emitting devices. Known examples of the cold cathode devices are surface-conduction emission (SCE) type electron-emitting devices, field emission type electron-emitting devices (to be referred to as FE type electron-emitting devices hereinafter), and metal /insulator/metal type electron-emitting devices (to be referred to as MIM type electron-emitting devices hereinafter).

A known example of the surface-conduction emission type emitting devices is described in, e.g., M. I. Elinson, "Radio Eng. Electron Phys.," 10, 1290 (1965) and other examples will be described later.

The surface-conduction emission type emitting device utilizes the phenomenon that electrons are emitted from a small-area thin film formed on a substrate by flowing a current parallel through the film surface. The surface-conduction emission type emitting device includes electron-emitting devices using an Au thin film [G. Dittmer, "Thin Solid Films", 9,317 (1972)], an $In_2O_3/SnO_2$ thin film [M. Hartwell and C. G. Fonstad, "IEEE Trans. ED Conf.", 519 (1975)], a carbon thin film [Hisashi Araki et al., "Vacuum", Vol. 26, No. 1, p. 22 (1983)], and the like, in addition to an $SnO_2$ thin film according to Elinson mentioned above.

FIG. 15 is a plan view showing the device by M. Hartwell et al. described above as a typical example of the device structures of these surface-conduction emission type emitting devices. Referring to FIG. 15, reference numeral 3001 denotes a substrate; and 3004, a conductive thin film made of a metal oxide formed by sputtering. This conductive thin film 3004 has an H-shaped pattern, as shown in FIG. 15. An electron-emitting portion 3005 is formed by performing electrification processing (referred to as forming processing to be described later) with respect to the conductive thin film 3004. An interval L in FIG. 15 is set to 0.5 to 1 mm, and a width W is set to 0.1 mm. The electron-emitting portion 3005 is shown in a rectangular shape at the center of the conductive thin film 3004 for the sake of illustrative convenience. However, this does not exactly show the actual position and shape of the electron-emitting portion.

In the above surface-conduction emission type emitting devices by M. Hartwell et al. and the like, typically the electron-emitting portion 3005 is formed by performing electrification processing called forming processing for the conductive thin film 3004 before electron emission. In the forming processing, for example, a constant DC voltage or a DC voltage which increases at a very low rate of, e.g., 1 V/min is applied across the two ends of the conductive thin film 3004 to partially destroy or deform the conductive thin film 3004, thereby forming the electron-emitting portion 3005 with an electrically high resistance. Note that the destroyed or deformed part of the conductive thin film 3004 has a fissure. Upon application of an appropriate voltage to the conductive thin film 3004 after the forming processing, electrons are emitted near the fissure.

Known examples of the FE type electron-emitting devices are described in W. P. Dyke and W. W. Dolan, "Field emission", Advance in Electron Physics, 8, 89 (1956) and C. A. Spindt, "Physical properties of thin-film field emission cathodes with molybdenium cones", J. Appl. Phys., 47, 5248 (1976).

FIG. 16 is a sectional view showing the device by C. A. Spindt et al. described above as a typical example of the FE type device structure. Referring to FIG. 16, reference numeral 3010 denotes a substrate; 3011, emitter wiring made of a conductive material; 3012, an emitter cone; 3013, an insulating layer; and 3014, a gate electrode. In this device, a voltage is applied between the emitter cone 3012 and the gate electrode 3014 to emit electrons from the distal end portion of the emitter cone 3012. As another FE type device structure, there is an example in which an emitter and a gate electrode are arranged on a substrate to be almost parallel to the surface of the substrate, in addition to the multilayered structure of FIG. 16.

A known example of the MIM type electron-emitting devices is described in C. A. Mead, "Operation of Tunnel-Emission Devices", J. Appl. Phys., 32,646 (1961). FIG. 17 shows a typical example of the MIM type device structure. FIG. 17 is a sectional view of the MIM type electron-emitting device. Referring to FIG. 17, reference numeral 3020 denotes a substrate; 3021, a lower electrode made of a metal; 3022, a thin insulating layer having a thickness of about 100 Å; and 3023, an upper electrode made of a metal and having a thickness of about 80 to 300 Å. In the MIM type electron-emitting device, an appropriate voltage is applied between the upper electrode 3023 and the lower electrode 3021 to emit electrons from the surface of the upper electrode 3023.

Since the above-described cold cathode devices can emit electrons at a temperature lower than that for hot cathode devices, they do not require any heater. The cold cathode device therefore has a structure simpler than that of the hot cathode device and can be micropatterned. Even if a large number of devices are arranged on a substrate at a high density, problems such as heat fusion of the substrate hardly arise. In addition, the response speed of the cold cathode device is high, while the response speed of the hot cathode device is low because it operates upon heating by a heater. For this reason, applications of the cold cathode devices have enthusiastically been studied.

Of cold cathode devices, the above surface-conduction emission type emitting devices are advantageous because they have a simple structure and can be easily manufactured. For this reason, many devices can be formed on a wide area. As disclosed in Japanese Patent Laid-Open No. 64-31332 filed by the present applicant, a method of arranging and driving a lot of devices has been studied.

Regarding applications of surface-conduction emission type emitting devices to, e.g., image forming apparatuses such as an image display apparatus and an image recording apparatus, electron sources, and the like have been studied.

As an application to image display apparatuses, in particular, as disclosed in the U.S. Pat. No. 5,066,883 and Japanese Patent Laid-Open Nos. 2-257551 and 4-28137 filed by the present applicant, an image display apparatus using the combination of an surface-conduction emission type emitting device and a fluorescent substance which emits light upon reception of an electron beam has been studied. This type of image display apparatus using the combination of the surface-conduction emission type emitting device and the fluorescent substance is expected to have more excellent characteristics than other conventional image display apparatuses. For example, in comparison with recent popular liquid crystal display apparatuses, the above display apparatus is superior in that it does not require a backlight because it is of a self-emission type and that it has a wide view angle.

A method of driving a plurality of FE type electron-emitting devices arranged side by side is disclosed in, e.g., U.S. Pat. No. 4,904,895 filed by the present applicant. As a known example of an application of FE type electron-emitting devices to an image display apparatus is a flat display apparatus reported by R. Meyer et al. [R. Meyer: "Recent Development on Microtips Display at LETI", Tech. Digest of 4th Int. Vacuum Microelectronics Conf., Nagahama, pp. 6–9 (1991)].

An example of an application of a larger number of MIM type electron-emitting devices arranged side by side to an image display apparatus is disclosed in Japanese Patent Laid-Open No. 3-55738 filed by the present applicant.

FIG. 18 is a partially cutaway perspective view of an example of a display panel portion as a constituent of a flat image display apparatus, showing the internal structure of the panel.

Referring to FIG. 18, reference numeral 3115 denotes a rear plate; 3116, a side wall; and 3117, a face plate. The rear plate 3115, the side wall 3116, and the face plate 3117 constitute an envelope (airtight container) for maintaining a vacuum in the display panel.

The rear plate 3115 has a substrate 3111 fixed thereon, on which N×M cold cathode devices 3112 are formed (M and N are positive integers equal to 2 or more, and properly set in accordance with a desired number of display pixels). The N×M cold cathode devices 3112 are arranged in a matrix with M row-direction wirings 3113 and N column-direction wirings 3114. The portion constituted by the substrate 3111, the cold cathode devices 3112, the row-direction wirings 3113, and the column-direction wirings 3114 will be referred to as a multi electron source. An insulating layer (not shown) is formed between each row-direction wiring 3113 and each column-direction wiring 3114, at least at a portion where they cross each other at a right angle, to maintain electric insulation therebetween.

A fluorescent film 3118 made of fluorescent substances is formed on the lower surface of the face plate 3117. The fluorescent film 3118 is coated with red (R), green (G), and blue (B) fluorescent substances (not shown), i.e., three primary color fluorescent substances. Black conductive members (not shown) are provided between the respective color fluorescent substances of the fluorescent film 3118. A metal back 3119 made of aluminum (Al) or the like is formed on the surface of the fluorescent film 3118, located on the rear plate 3115 side. Reference symbols Dx1 to DxM, Dy1 to DyN, and Hv denote electric connection terminals for an airtight structure provided to electrically connect the display panel to an electric circuit (not shown). The terminals Dx1 to DxM are electrically connected to the row-direction wirings 3113 of the multi-electron source; the terminals Dy1 to DyN, to the column-direction wirings 3114; and the terminal Hv, to the metal back 3119 of the face plate.

A vacuum of about $10^{-6}$ Torr is held in the above airtight container. As the display area of the image display apparatus increases, the apparatus requires a means for preventing the rear plate 3115 and the face plate 3117 from being deformed or destroyed by the pressure difference between the inside and outside of the airtight container. A method of thickening the rear plate 3115 and the face plate 3117 will increase the weight of the image display apparatus and cause an image distortion or parallax when the display screen is obliquely seen. In contrast to this, the structure shown in FIG. 18 includes structure support members (called spacers or ribs) 3120 formed of a relatively thin glass plate and used to resist the atmospheric pressure. With this structure, a spacing of sub-millimeters or several millimeters is generally ensured between the substrate 3111 on which the multi-electron source is formed and the face plate 3117 on which the fluorescent film 3118 is formed, and a high vacuum is maintained in the airtight container, as described above.

In the image display apparatus using the above display panel, when voltages are applied to the respective cold cathode devices 3112 through the outer terminals Dx1 to DxM and Dy1 to DyN, electrons are emitted by the cold cathode devices 3112. At the same time, a high voltage of several hundred volts to several kV is applied to the metal back 3119 through the outer terminal Hv to accelerate the emitted electrons to cause them to collide with the inner surface of the face plate 3117. With this operation, the respective color fluorescent substances constituting the fluorescent film 3118 are excited to emit light. As a result, an image is displayed on the screen.

The following problem is posed in the display panel of the image display apparatus described above.

When a color display apparatus is to be manufactured, in particular, the face plate 3117 having the fluorescent film 3118 coated with the respective color fluorescent substances, the substrate 3111 on which the cold cathode devices 3112 are formed, and the spacers 3120 provided between the substrate 3111 and the face plate 3117 must be assembled upon accurate positioning. As the display panel increases in area, however, positioning of these components becomes more difficult. As a result, a positional offset between the components may cause brightness irregularity or color misregistration on the display screen.

SUMMARY OF THE INVENTION

The present invention has been made in consideration of the above conventional techniques, and has its principal object to provide an image forming apparatus which reduces brightness irregularity and color misregistration to improve color reproduction characteristics.

It is another object of the present invention to provide a method of manufacturing an image forming apparatus, which can facilitate positioning of spacers in the image forming apparatus in assembling the apparatus.

According to the present invention, an image forming apparatus including an electron source, an image forming member having a plurality of striped fluorescent substances for emitting light of different colors and serving to form an image upon irradiation of electrons emitted by the electron source, and rectangular spacers arranged between the image forming member and a member opposing the image forming member, wherein the rectangular spacers are fixed to the member opposing the image forming member and in contact with the image forming member, and a longitudinal direction of the spacers crosses a longitudinal direction of the striped fluorescent substance.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

An image forming apparatus according to the present invention includes rectangular spacers placed between an image forming member having an striped arrangement of a plurality of fluorescent substances for emitting light beams of different colors and a member opposing the image forming member. The spacers are fixed on the member opposing the image forming member, and contact with the image forming member such that the longitudinal direction of the spacers crosses the longitudinal direction of the stripe-like fluorescent substances.

In a method of manufacturing an image forming apparatus according to the present invention, the rectangular spacers placed between an image forming member having an striped arrangement of a plurality of fluorescent substances for emitting light beams of different colors and a member opposing the image forming member is fixed to the member opposing the image forming member and brought into contact with the image forming member such that the longitudinal direction of the spacers crosses the longitudinal direction of the stripe-like fluorescent substances.

Figure 18:
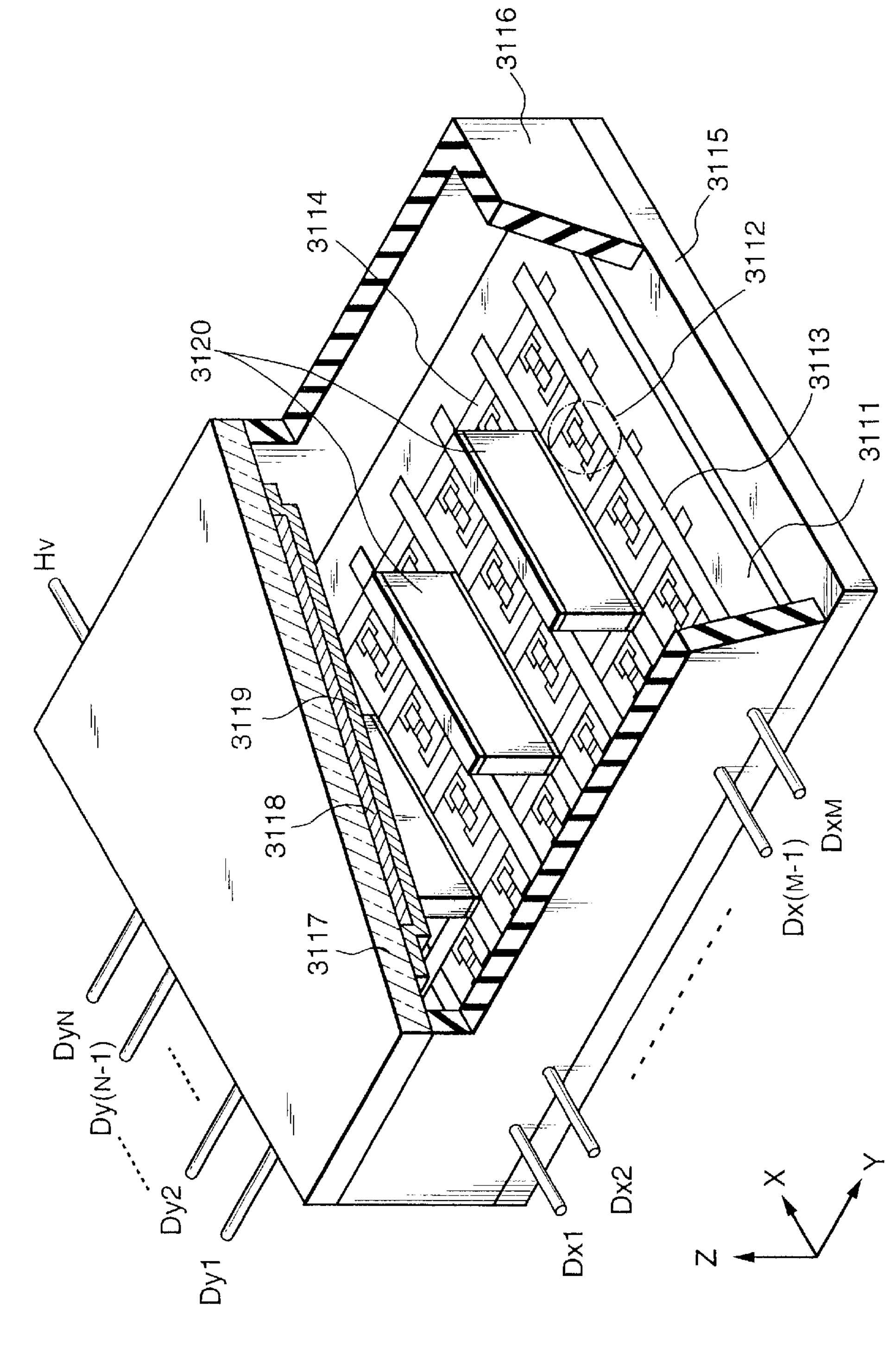
FIG. 18 is a partially cutaway perspective view showing the display panel of an image display apparatus.

The spacer in the present invention may include both an insulating spacer and a conductive spacer. For example, in the image forming apparatus shown in FIG. 18, the following points must be taken into consideration.

First, when some of the electrons emitted from a portion near the spacer 3120 collide with the spacer 3120, or ions produced owing the effect of emitted electrons are attached to the spacer 3120, the spacer 3120 may be charged. If the spacer 3120 is charged in this manner, the orbits of the electrons emitted by the cold cathode devices 3112 are deflected. As a result, the electrons reach improper positions on fluorescent substances, and a distorted image is displayed near the spacer 3120.

Second, since a high voltage of several hundred volts or more (i.e., a high electric field of 1 kV/mm or more) is applied between the face plate 3117 and the multi-electron source for accelerating the electrons emitted by the cold cathode devices 3112, discharge may occur on the surface of the spacer 3120. When the spacer 3120 is charged as in the above case, in particular, discharge may be induced.

In consideration of the above points, a spacer having insulating properties good enough to stand a high application voltage and also having a conductive surface that can reduce the amount of charge is preferably used in the present invention to suppress deflection of the orbits of electron beams and discharge near the spacer.

An electron source in the present invention may include an electron source having cold cathode devices or hot cathode devices. An electron source having cold cathode devices such as surface-conduction emission type emitting devices, FE type devices, MIM type devices, or the like is preferably used in the present invention. An electron source having surface-conduction emission type emitting devices, in particular, is more preferably used in the present invention.

Since the above-described cold cathode devices can emit electrons at a temperature lower than that for hot cathode devices, they do not require a heater. The cold cathode device therefore has a structure simpler than that of the hot cathode device and can be micropatterned. Even if a large number of devices are arranged on a substrate at a high density, problems such as heat fusion of the substrate hardly arise. In addition, the response speed of the cold cathode device is high, while the response speed of the hot cathode device is low because it operates upon heating by a heater.

For example, of all the cold cathode devices, a surface-conduction emission type emitting device, in particular, has a simple structure and can be easily manufactured, a large number of such devices can be formed throughout a large area.

According to the present invention, each spacer is preferably fixed to the member opposing the image forming member by bonding the spacer to the member. For example, the spacer may be bonded to the member with a joining material such as frit glass which is fused when heated.

A preferred embodiment of the present invention will be described below with reference to the accompanying drawings.

Figure 1:
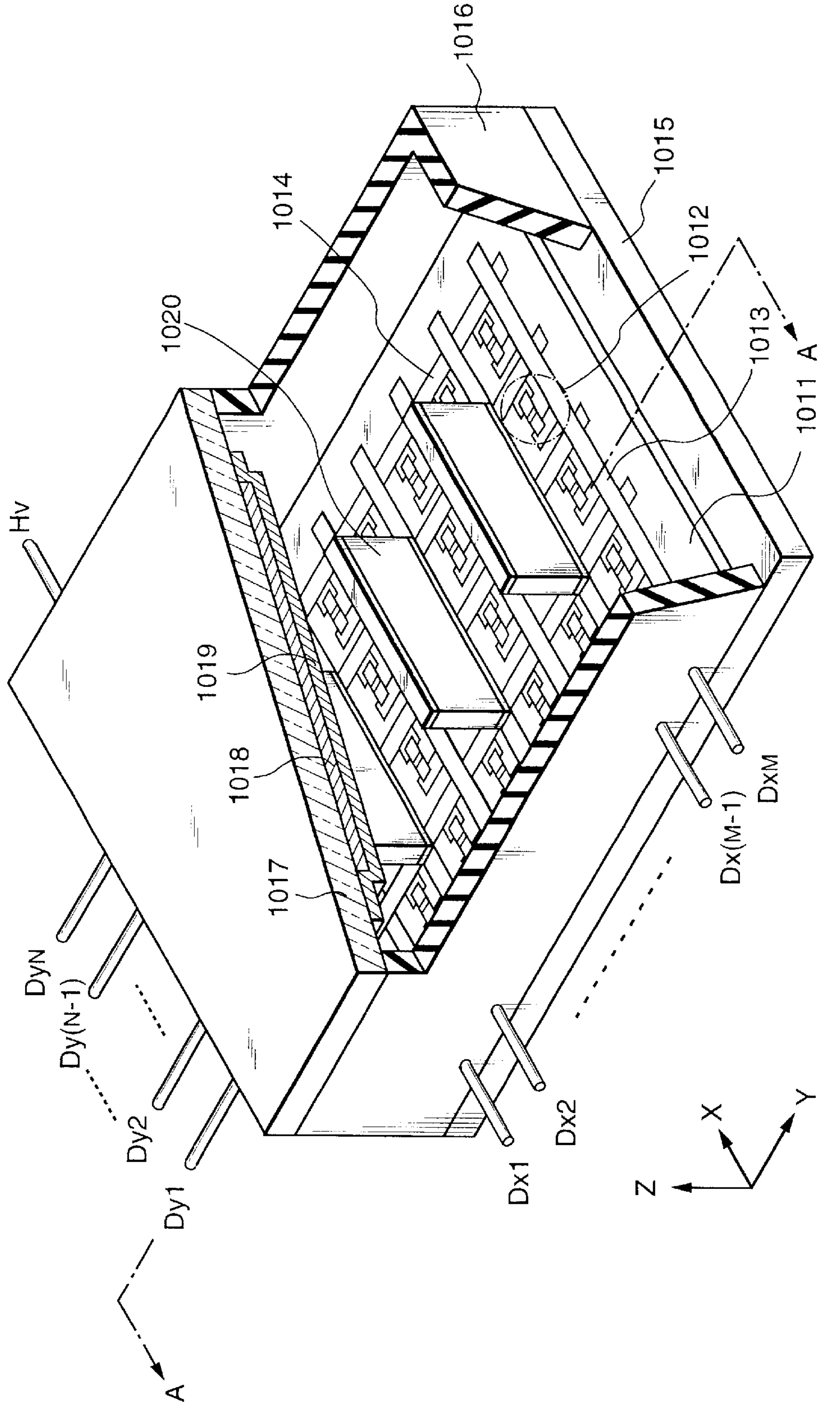
FIG. 1 is a partially cutaway perspective view of a display panel of an image display apparatus according to an embodiment of the present invention.

FIG. 1 is a partially cutaway perspective view of a display panel used in this embodiment, showing the internal structure of the panel.

Figure 2:
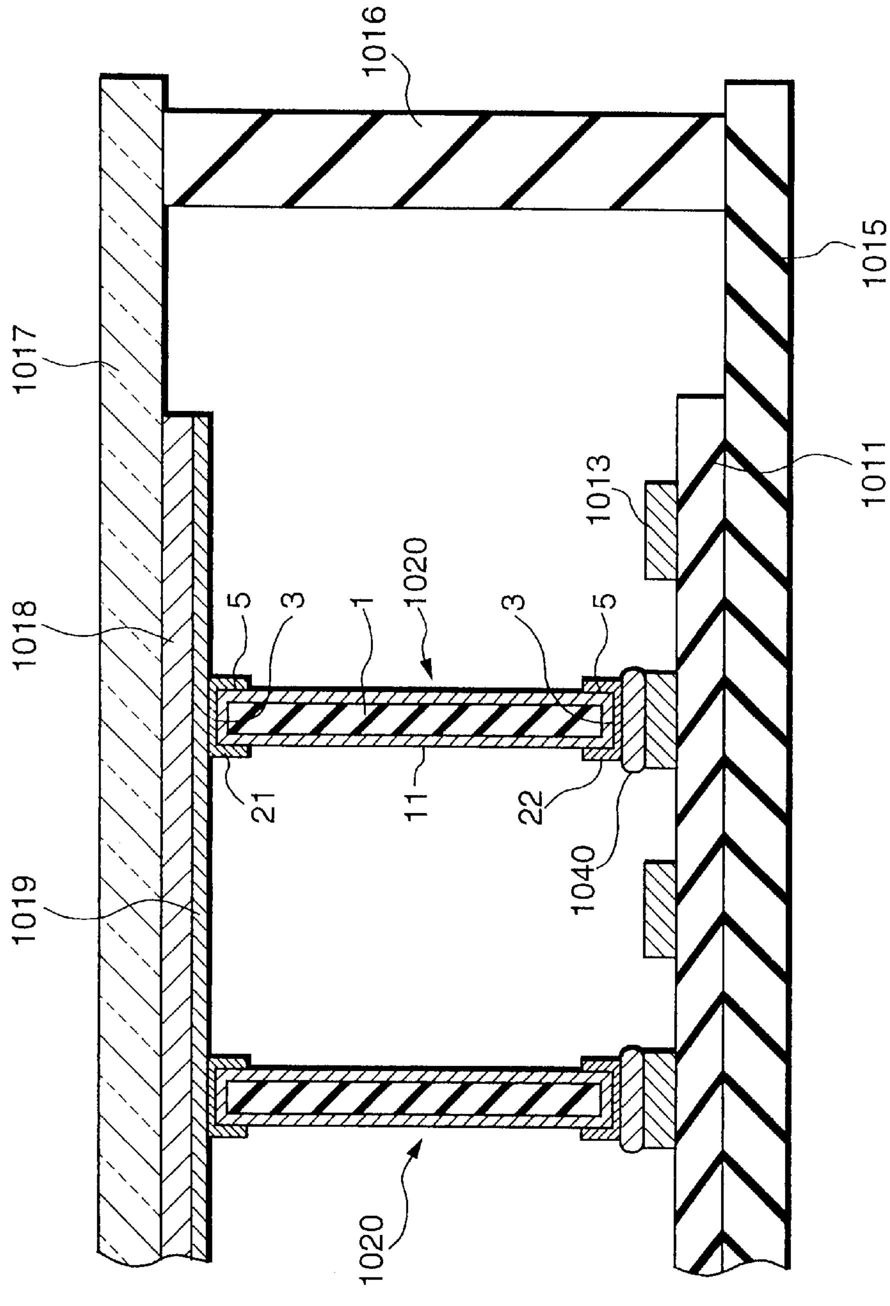
FIG. 2 is a sectional view taken along a line A—A' of the display panel (FIG. 1) according to an embodiment of the present invention.

FIG. 2 is a sectional view taken along a line A—A' in FIG. 2. The same reference numerals in FIG. 2 denote the same parts as in FIG. 1.

Referring to FIG. 1, reference numeral 1015 denotes a rear plate; numeral 1016 denotes a side wall; and numeral 1017 denotes a faceplate. The rear plate 1015, the side wall 1016, and the face plate 1017 constitute an envelope (airtight container) for maintaining a vacuum in the display panel. Spacers 1020 are mounted in the airtight container to resist the atmospheric pressure. A substrate 1011 is fixed to the rear plate 1015. N×M cold cathode devices 1012 are formed on the substrate 1011 and connected to each other through M row-direction (X-direction) wirings 1013 and N column-direction (Y-direction) wirings 1014.

A fluorescent film 1018 is formed on the lower surface of the face plate 1017. A metal back 1019 made of aluminum (Al) or the like is formed on the surface of the fluorescent film 1018, located on the rear plate 1015 side.

Figure 3A:
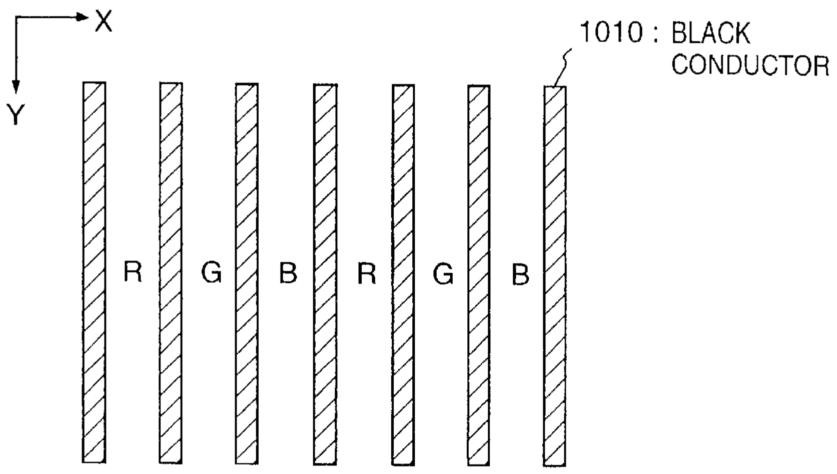
FIG. 3A is a plan view showing an example of the striped fluorescent substance arrangement of the face plate of the display panel according to the embodiment of the present invention.

As shown in FIG. 3A, the fluorescent film 1018 has red (R), green (G), and blue (B) fluorescent substances, i.e., three primary color fluorescent substances. These fluorescent substances are colored in a striped form along the column direction (Y direction) in FIG. 1. Black conductive members 1010 are arranged between the above fluorescent substances.

As shown in FIG. 2, the spacer 1020 has high-resistance films 11 formed on the surfaces of an insulating member 1 and also has low-resistance films 21 and 22 formed on abutment surfaces 3, of the spacer 1020, which face the inner surface (on the metal back 1019 side) of the face plate 1017 and the surface of the substrate 1011 (row-direction wiring 1013) and on side surface portions 5 in contact with the abutment surfaces 3. The spacers 1020 are arranged along the row-direction (X-direction) wirings 1013 on the substrate 1011 and fixed thereon through a joining material 1040. The high-resistance films 11 are electrically connected to the row-direction wirings 1013 on the substrate 1011 through the low-resistance films 22 and the joining material 1040, and electrically connected to the metal back 1019 on the face plate 1017 through the low-resistance films 21.

Figure 3B:
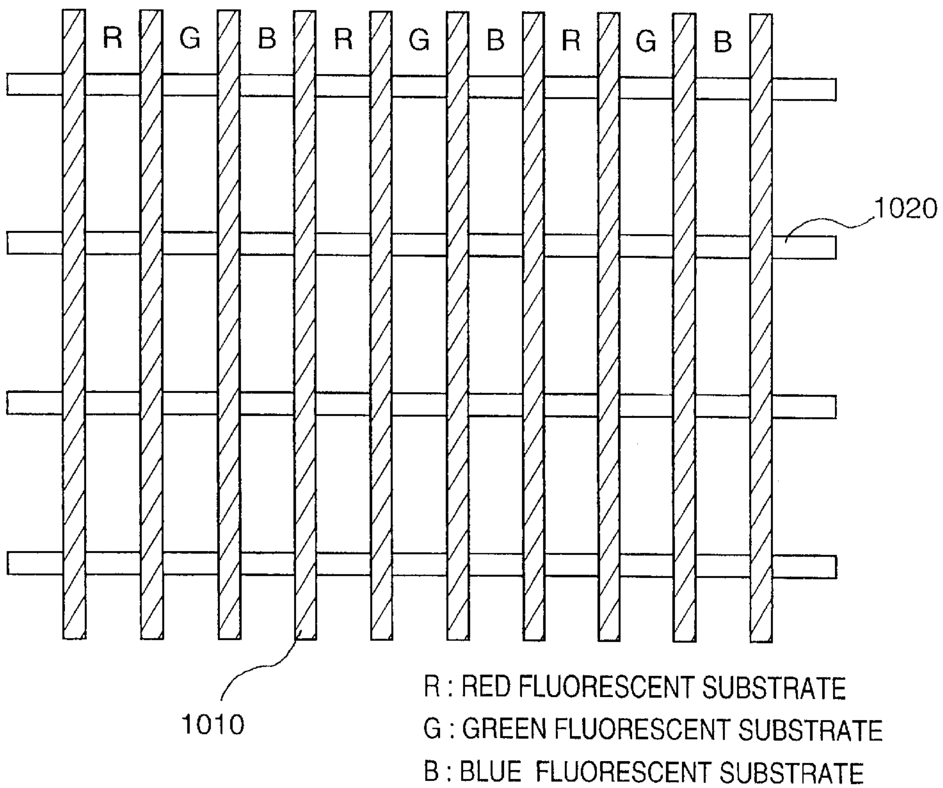
FIG. 3B is a view showing the positional relationship between the stripe-like fluorescent substances and spacers.

FIG. 3B show the positional relationship between the spacers 1020 and the fluorescent substances on the faceplate 1017. Referring to FIG. 3B, the face plate 1017 and the spacers 1020 are arranged such that the longitudinal direction (X direction) of the spacers 1020 crosses the fluorescent substances and the black conductive members 1010 extending in the Y direction of the face plate 1017 at a right angle.

A sequence for assembling the panel shown in FIGS. 1 and 2 will be described below with reference to FIGS. 14A–14D.

(Steps a to d)

(Step a): The substrate 1011 on which a plurality of cold cathode devices and pluralities of row- and column-direction wirings connecting the devices to each other are formed as shown in FIG. 1 is mounted on the rear plate 1015.

(Step b): The joining material 1040 is applied onto the row-direction wirings 1013 on the substrate 1011.

(Step c): The spacers 1020, each having the high-resistance films 11 and the low-resistance films 21 and 22 as shown in FIG. 2, are fixed to the substrate 1011 through the joining material 1040.

(Step d): The rear plate 1015, the side wall 1016, and the face plate 1017 on which the fluorescent film 1018 and the metal back 1019 are formed as shown in FIGS. 1 to 3 are sealed to form an airtight container.

With the above arrangement of the display panel and the above assembly process, the following effects can be obtained.

Sufficiently accurate positioning of the spacers 1020 and the joining material 1040 to the substrate 1011 is important in controlling the influences of the spacers and the joining material on the orbits of the electrons emitted by the near cold cathode devices 1012. Assume that an electron orbit is to be controlled by the electric field produced by the low-resistance film 22 of the spacer 1020. In this case, if a positional offset of the spacer 1020 occurs, a desired electric field distribution cannot be obtained, resulting in an electron orbit offset.

In this embodiment, since the spacers 1020 are fixed to the substrate 1011 first, positioning of the spacers 1020 to the substrate 1011 is facilitated. An increase in yield and simplification of a positioning mechanism can therefore be attained in comparison with a case wherein the spacers 1020 are fixed to both the face plate 1017 and the rear plate 1015 at once.

When the above components are to be sealed to form an airtight container, the respective color fluorescent substances arranged on the face plate 1017 must be properly positioned to the cold cathode devices 1012 arranged on the substrate 1011. Since this embodiment uses the face plate having the fluorescent film 1018 constituted by the striped fluorescent substances extending along the column direction (Y direction), it suffices if the substrate 1011 and the face plate 1017 are satisfactorily positioned in the row direction (X direction) alone. In addition, since the spacers 1020 are fixed to the substrate 1011 first, the positions where the spacers 1020 are in contact with the face plate 1017 can be kept constant with respect to the positions where the electrons emitted by the cold cathode devices 1012 are irradiated on the face plate 1017. That is, the spacers 1020 do not block electrons approaching the face plate 1017 and have no adverse influences on electron orbits.

This embodiment can therefore attain an increase in yield and simplification of a positioning mechanism as compared with a case wherein sufficiently accurate positioning is required in both the row and column directions (X and Y directions).

The spacers 1020 extending in the row direction (X direction) are arranged to cross the stripe-like black conductive members 1010 extending in the column direction (Y direction). That is, the spacers 1020 are pressed against the black conductive members 1010 to be contacted to the face plate 1017, and hence do not squash the respective color fluorescent substances below the thickness of the black conductive members 1010 regardless of the assembly precision in the above sealing process. Almost no changes in reflection/scattering of light from the respective fluorescent substances therefore occur at the positions where the spacers 1020 are in contact with the face plate 1017 when viewed from the observation side of the face plate 1017.

The following combinations of components associated with abutment of the spacers 1020, the joining material 1040 and the substrate 1011 (row-direction wirings 1013) in the arrangement of the display panel according to the embodiment described above are incorporated in the concepts of the present invention.

The spacer abutment portion of each row-direction wirings 1013 has a concave shape. The joining material 1040 is applied to this concave portion. The low-resistance film 22 of the spacer 1020, located on the substrate 1011 side, is formed on only the abutment surface 3 on the row-direction wiring 1013. This arrangement can prevent the electric field formed by the spacer 1020*a* and the joining material 1040 from influencing the orbits of the electrons emitted by the cold cathode device 1012. Note that such a concave wiring can be formed by, for example, printing and stacking two layers by screen printing.

Each spacer 1020 is fixed by using a soft metal material as the joining material 1040. The low-resistance film 22 of the spacer 1020, located on the substrate 1011 side, is formed on only the abutment surface 3 on the row-direction wiring 1013. Since the joining material 1040 includes no filler, the material can be spread thin enough to prevent itself from influencing the orbits of the electrons emitted by the cold cathode device 1012. For example, indium (In) can be used as this material.

As a more preferable condition, a material for the low-resistance films 21 and 22 has the property of not increasing in resistance owing to a change in quality such as oxidation/coagulation or not causing a conduction failure in the joining portions with the high-resistance films 11. A noble metal material, platinum, in particular, is a preferable material from this viewpoint. In this case, underlying layers having a thickness of several nm to several ten nm and made of a metal material such as Ti, Cr, or Ta are preferably formed to allow the low-resistance films 21 and 22 made of a noble metal to exhibit sufficient adhesion characteristics with respect to the insulating member 1 or the high-resistance films 11.

The arrangement of the display panel of the image display apparatus and a method of manufacturing the same according to this embodiment will be described in detail with reference to FIG. 1.

In FIG. 1, reference numeral 1015 denotes a rear plate; numeral 1016 denotes a side wall; and numeral 1017 denotes a face plate. These parts constitute an airtight container for maintaining the inside of the display panel vacuum. To construct the airtight container, it is necessary to seal-connect the respective parts to obtain sufficient strength and maintain airtight condition. For example, frit glass is applied to junction portions, and sintered at 400 to 500° C. in air or nitrogen atmosphere, thus the parts are seal-connected. A method for exhausting air from the inside of the container will be described later. In addition, since a vacuum of about $10^{-6}$ Torr is maintained in the above airtight container, the spacers 1020 are arranged as a structure resistant to the atmospheric pressure to prevent the airtight container from being destroyed by the atmospheric pressure or an unexpected impact.

The rear plate 1015 has the substrate 1011 fixed thereon, on which N×M cold cathode devices 1012 are formed (M, N =positive integer equal to 2 or more, properly set in accordance with a desired number of display pixels. For example, in a display apparatus for high-resolution television display, preferably N=3,000 or more, M=1,000 or more). The N×M cold cathode devices are arranged in a simple matrix with the M row-direction wirings 1013 and the N column-direction wirings 1014. The portion constituted by the components denoted by references 1011 to 1014 will be referred to as a multi-electron source.

If the multi-electron source used in the image display apparatus according to this embodiment is an electron source constituted by cold cathode devices arranged in a simple matrix, the material and shape of each cold cathode device and the manufacturing method are not specifically limited. For example, therefore, cold cathode devices such as surface-conduction emission type emitting devices, FE type devices, or MIN devices can be used.

Next, the structure of a multi-electron source having surface-conduction emission type emitting devices (to be described later) arranged as cold cathode devices on a substrate with the simple-matrix wiring will be described below.

Figure 4:
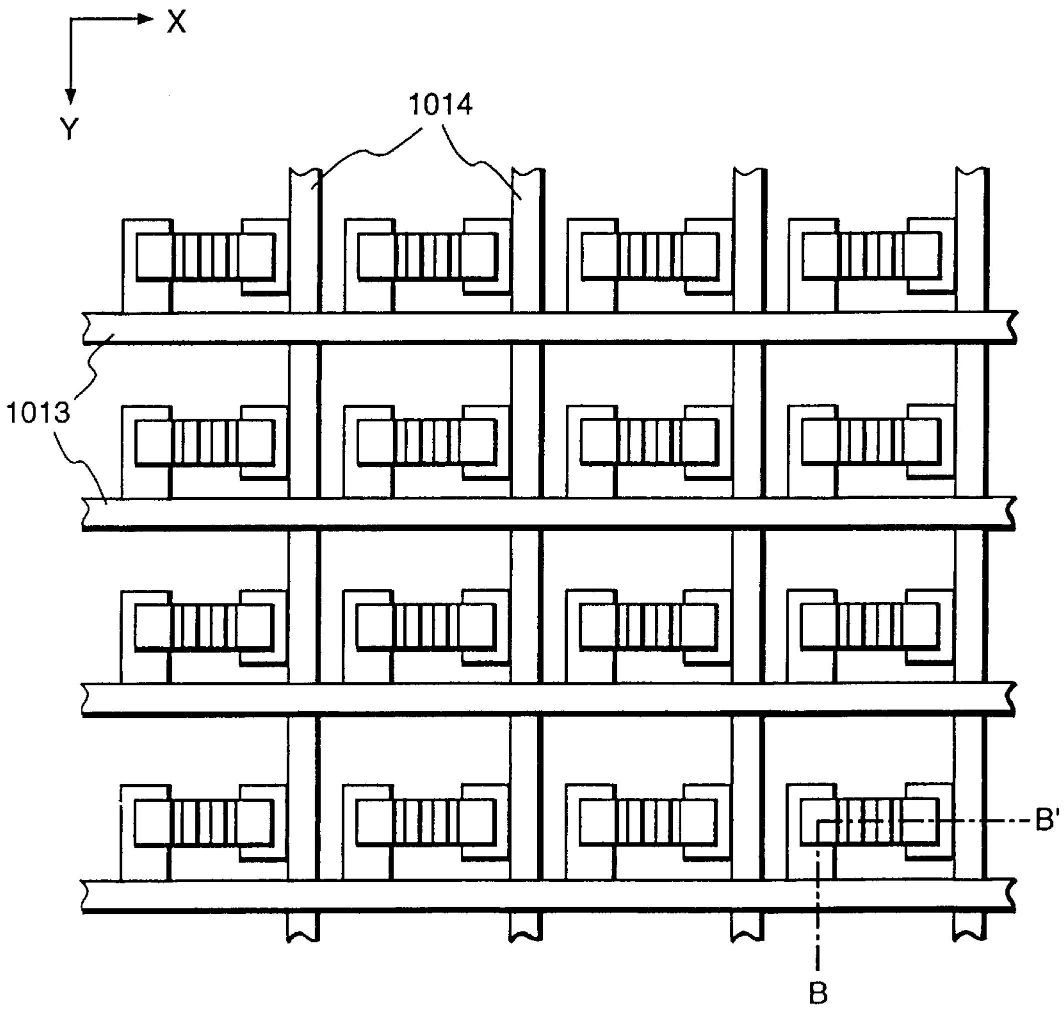
FIG. 4 is a plan view showing part of the substrate of a multi-electron source used in the embodiment.

FIG. 4 is a plan view of the multi-electron source used in the display panel in FIG. 1. There are surface-conduction emission type emitting devices similar to those shown in FIGS. 6A and 6B on the substrate 1011. These devices are arranged in a simple matrix with the row-direction wiring 1013 and the column-direction wiring 1014. At an intersection of the wirings 1013 and 1014, an insulating layer (not shown) is formed between the wires, to maintain electrical insulation.

Figure 5:
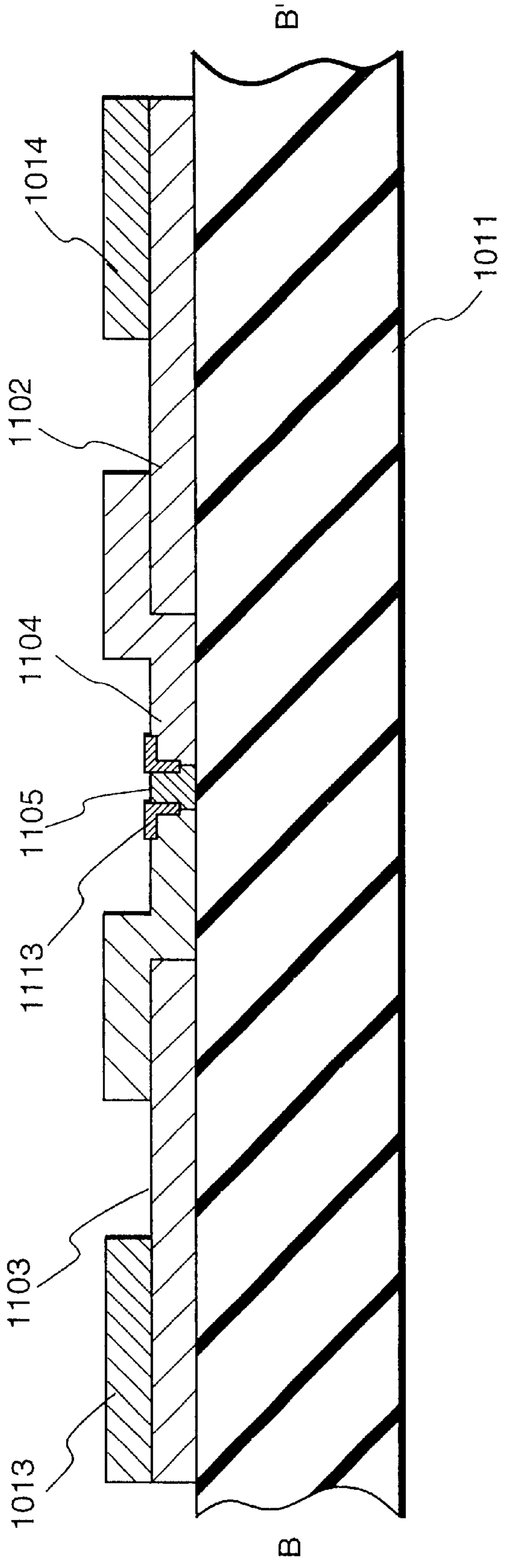
FIG. 5 is a sectional view showing part of the substrate of the multi-electron source used in the embodiment.

FIG. 5 shows a cross-section cut out along the line B–B' in FIG. 4.

Note that a multi-electron source having such a structure is manufactured by forming the row- and column-direction wirings 1013 and 1014, the inter-electrode insulating layers (not shown), the device electrodes and conductive thin films on the substrate, then supplying electricity to the respective devices via the row- and column-direction wirings 1013 and 1014, thus performing the forming processing (to be described later) and the activation processing (to be described later).

In this embodiment, the substrate 1011 of the multi-electron source is fixed to the rear plate 1015 of the airtight container. If, however, the substrate 1011 of the multi-electron source has sufficient strength, the substrate 1011 of the multi electron source may also serve as the rear plate of the airtight container.

The fluorescent film 1018 is formed on the lower surface of the face plate 1017. As this embodiment is a color display apparatus, the fluorescent film 1018 is coated with red, green, and blue fluorescent substances, i.e., three primary color fluorescent substances. As shown in FIG. 3A, the respective color fluorescent substances are formed into a striped structure, and black conductive members 1010 are provided between the fluorescent substances. The purpose of providing the black conductive members 1010 is to prevent display color misregistration even if the electron-beam irradiation position is shifted to some extent, to prevent degradation of display contrast by shutting off reflection of external light, and the like.

In this embodiment of the present invention, the black conductive member 1010 must also serve as a press contact portion for the spacer 1020. The following are the preferable conditions for this purpose.

The black conductive members should be high strength enough to resist the atmospheric pressure.

Each black conductive member should have a predetermined thickness or more (1 μm or more, and more preferably, 5 μm or more) to prevent the reflection characteristics of the fluorescent film 1018 from changing upon contacting each spacer 1020.

As a material for the black conductive member 1010, a material mainly consisting of graphite, a material having graphite dispersed in glass, or the like can be used, however, any other materials may be used as long as the above purpose can be attained.

Furthermore, the metal back 1019, which is well-known in the CRT field, is provided on the rear-plate-side surface of the fluorescent film 1018. The purpose of providing the metal back 1019 is to improve the light-utilization ratio by mirror-reflecting part of the light emitted by the fluorescent film 1018, to protect the fluorescent film 1018 from collision with negative ions, to be used as an electrode for applying an electron-beam accelerating voltage, to be used as a conductive path for electrons which excited the fluorescent film 1018, and the like. The metal back 1019 is formed by forming the fluorescent film 1018 on the face plate 1017, smoothing the front surface of the fluorescent film 1018, and depositing Al thereon by vacuum deposition. Note that when fluorescent substances for a low voltage is used for the fluorescent film 1018, the metal back 1019 is not used.

Furthermore, for application of an accelerating voltage or improvement of the conductivity of the fluorescent film, transparent electrodes made of, e.g., ITO may be provided between the face plate 1017 and the fluorescent film 1018, although such electrodes are not used in this embodiment.

FIG. 2 is a schematic sectional view taken along a line A–A' in FIG. 1. The same reference numerals in FIG. 2 denote the same parts as in FIG. 1. Each spacer 1020 is a member obtained by forming the high-resistance films 11 on the surfaces of the insulating member 1 to prevent charge-up and also forming the low-resistance films 21 and 22 on the abutment surfaces 3 and the side surface portions 5, of the spacer 1020, which face the inner surface (on the metal back 1019 and the like) of the face plate 1017 and the surface of the substrate 1011 (row- or column-direction wiring 1013 or 1014), respectively. A necessary number of such spacers are fixed on the surface of the substrate 1011 at necessary intervals with the joining material 1040 to attain the above purpose. In addition, the high-resistance films 11 are formed at least the surfaces, of the surfaces of the insulating member 1, which are exposed in a vacuum in the airtight container, and are electrically connected to the surface of the substrate 1011 (row- or column-direction wiring 1013 or 1014) through the low-resistance films 21 and 22 on the spacer 1020 and the joining material 1040. In this embodiment, each spacer 1020 has a thin plate-like shape, extends along a corresponding row-direction wiring 1013, and is electrically connected thereto through the low-resistance film 22.

The spacer 1020 preferably has insulating properties good enough to stand a high voltage applied between the row- and column-direction wirings 1013 and 1014 on the substrate 1011 and the metal back 1019 on the inner surface of the face plate 1017, and conductivity enough to prevent the surface of the spacer 1020 from being charged.

As the insulating member 1 of the spacer 1020, for example, a silica glass member, a glass member containing a small amount of an impurity such as Na, a soda-lime glass member, or a ceramic member consisting of alumina or the like is available. Note that the insulating member 1 preferably has a thermal expansion coefficient near the thermal expansion coefficients of the airtight container and the substrate 1011.

The current obtained by dividing an accelerating voltage Va applied to the face plate 1017 (the metal back 1019 and the like) on the high potential side by a resistance Rs of the high-resistance films 11 of the spacer 1020 flows in the high-resistance films 11. The resistance Rs of the high-resistance films 11 of the spacer 1020 is set in a desired range from the viewpoint of prevention of charge-up and consumption power. A sheet resistance R(Ω/sq) is preferably set to $10^{12}$ Ω/sq or less from the viewpoint of prevention of charge-up. To obtain a sufficient charge-up prevention effect, the sheet resistance R is preferably set to $10^{11}$ Ω/sq or less. The lower limit of this sheet resistance depends on the shape of each spacer 1020 and the voltage applied between the spacers 1020, and is preferably set to $10^{5}$ Ω/sq or more.

A thickness t of a charge-up prevention film (high-resistance film 11) formed on the insulating member 1 preferably falls within a range of 10 nm to 1 μm. A thin film having a thickness of 10 nm or less is generally formed into an island-like shape and exhibits unstable resistance depending on the surface energy of the material and the adhesion properties with the insulating member 1, resulting in poor reproduction characteristics. In contrast to this, if the thickness t is 1 μm or more, the film stress increases to increase the possibility of peeling of the film. In addition, a longer period of time is required to form a film, resulting in poor productivity. The thickness of the high-resistance film 11 preferably falls within a range of 50 to 500 nm. The sheet resistance R (Ω/sq) is ρ/t, and a resistivity ρ of the high-resistance film 11 preferably falls within a range of 0.1 Ωcm to $10^{8}$ Ωcm in consideration of the preferable ranges of R (Ω/sq) and t. To set the sheet resistance and the film thickness in more preferable ranges, the resistivity ρ is preferably set to $10^{2}$ to $10^{6}$ Ωcm.

As described above, when a current flows in the high-resistance films 11 formed on the insulating member 1 or the overall display generates heat during operation, the temperature of each spacer 1020 rises. If the resistance temperature coefficient of the charge-up prevention film (high-resistance film 11) is a large negative value, the resistance decreases with an increase in temperature. As a result, the current flowing in the spacer 1020 increases to further raise the temperature. The current keeps increasing beyond the limit of the power supply. It is empirically known that the resistance temperature coefficient which causes such an excessive increase in current is a negative value whose absolute value is 1% or more. That is, the resistance temperature coefficient of the high-resistance film is preferably set to less than −1%.

As a material for the high-resistance film 11 having charge-up prevention properties, for example, a metal oxide can be used. Of metal oxides, a chromium oxide, nickel oxide, or copper oxide is preferably used. This is because, these oxides have relatively low secondary electron-emitting efficiency, and are not easily charged even if the electrons emitted by the cold cathode device 1012 collide with the spacer 1020. In addition to such metal oxides, a carbon material is preferably used because it has low secondary electron-emitting efficiency. Since an amorphous carbon material has a high resistance, the resistance of the spacer 1020 can be easily controlled to a desired value.

An aluminum-transition metal alloy nitride is preferably used as another material for the high-resistance film 11 having charge-up prevention characteristics because the resistance can be controlled in a wide resistance range from the resistance of a good conductor to the resistance of an insulator by adjusting the composition of the transition metal. This nitride is a stable material which undergoes only a slight change in resistance in the manufacturing process for the display apparatus (to be described later). In addition, this material has a resistance temperature coefficient of less than −1% and hence can be easily used in practice. As a transition metal element, Ti, Cr, Ta, or the like is available.

The alloy nitride film is formed on the insulating member 1 by a thin film formation means such as sputtering, reactive sputtering in a nitrogen atmosphere, electron beam deposition, ion plating, or ion-assisted deposition. A metal oxide film can also be formed by the same thin film formation method except that oxygen is used instead of nitrogen. Such a metal oxide film can also be formed by CVD or alkoxide coating. A carbon film is formed by deposition, sputtering, CVD, or plasma CVD. When an amorphous carbon film is to be formed, in particular, hydrogen is contained in an atmosphere in the process of film formation, or a hydrocarbon gas is used as a film formation gas.

The low-resistance films 21 and 22 of the spacer 1020 are formed to electrically connect the high-resistance films 11 to the face plate 1017 (metal back 1019 and the like) on the high potential side and the substrate 1011 (row- or column-direction wiring 1013 or 1014 and the like) on the low potential side. The low-resistance films 21 and 22 will also be referred to as intermediate electrode layers (intermediate layers) hereinafter. These intermediate electrode layers (intermediate layers) have a plurality of functions as described below.

(1) Electrically connect the high-resistance films 11 to the face plate 1017 and the substrate 1011.

As described above, the high-resistance films 11 are formed to prevent the surface of the spacer 1020 from being charged. When, however, the high-resistance films 11 are connected to the face plate 1017 (metal back 1019 and the like) and the substrate 1011 (wiring 1013 and 1014 and the like) directly or through the joining material 1040, a large contact resistance is produced at the connecting portions. As a result, the charges produced on the surface of the spacer 1020 may not be quickly removed. To prevent this, the low-resistance intermediate layers are formed on the abutment surfaces 3 which are in contact with the face plate 1017, the substrate 1011, and the joining material 1040 or the side surface portions 5 of the spacer 1020.

(2) Make the potential distributions of the high-resistance films 11 uniform.

The electrons emitted by the cold cathode devices 1012 follow the orbits formed in accordance with the potential distributions formed between the face plate 1017 and the substrate 1011. To prevent the electron orbits from being disturbed near the spacers 1020, the entire potential distributions of the spacers 1020 must be controlled. When the high-resistance films 11 are connected to the face plate 1017 (metal back 1019 and the like) and the substrate 1011 (row- or column-direction wiring 1013 or 1014 and the like) directly or through the joining material 1040, variations in the connected state occurs owing to the contact resistance at the connecting portions. As a result, the potential distribution of each high-resistance film 11 may deviate from a desired value. To prevent this, the low-resistance intermediate layers are formed along the entire length of the spacer end portions (the abutment surfaces 3 or the side surface portions 5), of the spacer 1020, which are in contact with the face plate 1017 and the substrate 1011. By applying a desired potential to each intermediate layer portion, the overall potential of each high-resistance film 11 can be controlled.

(3) Control the orbits of emitted electrons.

The electrons emitted by the cold cathode devices 1012 follow the orbits formed in accordance with the potential distributions formed between the face plate 1017 and the substrate 1011. The electrons emitted from the cold cathode devices 1012 near the spacers 1020 may be subjected to constrains (changes in the positions of the row- and column-direction wirings and the cold cathode devices) accompanying the arrangement of the spacers 1020. In this case, to form an image without distortion and irregularity, the orbits of the electrons emitted by the cold cathode devices must be controlled to irradiate the electrons at desired positions on the face plate 1017. The formation of the low-resistance intermediate layers on the side surface portions 5 in contact with the face plate 1017 and the substrate 1011 allows the potential distributions near the spacer 1020 to have desired characteristics, thereby controlling the orbits of emitted electrons.

As a material for the low-resistance films 21 and 22, a material having a resistance sufficiently lower than that of the high-resistance film 11 can be selected. For example, such a material is properly selected from metals such as Ni, Cr, Mo, W, Ti, Al, Cu, and Pd, alloys thereof, printed conductors constituted by metals such as Pd, Ag, $RuO_2$, and Pd-Ag or metal oxides and glass or the like, transparent conductors such as $In_2O_3$-$SnO_2$, and semiconductor materials such as polysilicon.

The joining material 1040 needs to have conductivity to electrically connect the spacers 1020 to the row-direction wirings 1013. That is, a conductive adhesive or frit glass containing metal particles is suitably used.

Reference symbols Dx1 to DxM, Dy1 to DyN, and Hv denote electric connection terminals for an airtight structure provided to electrically connect the display panel to an electric circuit (not shown). The terminal Dx1 to DxM are electrically connected to the row-direction wirings 1013 of the multi-electron source; the terminals Dy1 to DyN, to the column-direction wirings 1014; and the terminal Hv, to the metal back 1019 of the face plate 1017.

To evacuate the airtight container, after forming the airtight container, an exhaust pipe and a vacuum pump (neither is shown) are connected, and the airtight container is evacuated to a vacuum of about $10^{-7}$ Torr. Thereafter, the exhaust pipe is sealed. To maintain the vacuum in the airtight container, a getter film (not shown) is formed at a predetermined position in the airtight container immediately before/after the sealing. The getter film is a film formed by heating and evaporating a getter material mainly consisting of, e.g., Ba, by heating or RF heating. The suction effect of the getter film maintains a vacuum of $1\times10^{-5}$ or $1\times10^{-7}$ Torr in the container.

In the image display apparatus using the above display panel, when voltages are applied to the cold cathode devices 1012 through the outer terminals Dx1 to DxM and Dy1 to DyN, electrons are emitted by the cold cathode devices 1012. At the same time, a high voltage of several hundred V to several kV is applied to the metal back 1019 through the outer terminal Hv to accelerate the emitted electrons to cause them to collide with the inner surface of the face plate 1017. With this operation, the respective color fluorescent substances constituting the fluorescent film 1018 are excited to emit light to display an image.

The voltage to be applied to each surface-conduction emission type emitting device 1012 as a cold cathode device in this embodiment of the present invention is normally set to about 12 to 16 V; a distance d between the metal back 1019 and the cold cathode device 1012, about 0.1 mm to 8 mm; and the voltage to be applied between the metal back 1019 and the cold cathode device 1012, about 0.1 kV to 10 kV.

The basic arrangement of the display panel, the method of manufacturing the same, and the image display apparatus according to the embodiment of the present invention have been briefly described above.

(Method of Manufacturing Multi-Electron Source)

A method of manufacturing the multi-electron source used in the above display panel will be described below. In manufacturing the multi-electron source used in the image display apparatus of this embodiment, any material, shape, and manufacturing method for each surface-conduction emission type emitting device may be employed as long as an electron source can be obtained by arranging cold cathode devices in a simple matrix. Therefore, cold cathode devices such as surface-conduction emission type emitting devices, FE type devices, or MIM type devices can be used.

Under circumstances where inexpensive display apparatuses having large display areas are required, a surface-conduction emission type emitting device, of these cold cathode devices, is especially preferable. More specifically, the electron-emitting characteristic of an FE type device is greatly influenced by the relative positions and shapes of the emitter cone and the gate electrode, and hence a high-precision manufacturing technique is required to manufacture this device. This poses a disadvantageous factor in attaining a large display area and a low manufacturing cost. According to an MIM type device, the thicknesses of the insulating layer and the upper electrode must be decreased and made uniform. This also poses a disadvantageous factor in attaining a large display area and a low manufacturing cost. In contrast to this, a surface-conduction emission type emitting device can be manufactured by a relatively simple manufacturing method, and hence an increase in display area and a decrease in manufacturing cost can be attained. The present inventors have also found that among the surface-conduction emission type emitting devices, an electron beam source having an electron-emitting portion or its peripheral portion consisting of a fine particle film is excellent in electron-emitting characteristic and can be easily manufactured. Such a device can therefore be most suitably used for the multi-electron source of a high-brightness, large-screen image display apparatus. For this reason, in the display panel of this embodiment, surface-conduction emission type emitting devices each having an electron-emitting portion or its peripheral portion made of a fine particle film are used. The basic structure, manufacturing method, and characteristics of the preferred surface-conduction emission type emitting device will be described first. The structure of the multi-electron source having many devices wired in a simple matrix will be described later.

(Preferred Structure of Surface-Conduction Emission Type Emitting Device and Preferred Manufacturing Method)

Typical examples of surface-conduction emission type emitting devices each having an electron-emitting portion or its peripheral portion made of a fine particle film include two types of devices, namely flat and step type devices.

(Flat Surface-Conduction Emission Type Emitting Device)

First, the structure and manufacturing method of a flat surface-conduction emission type emitting device will be described.

Figure 6A:
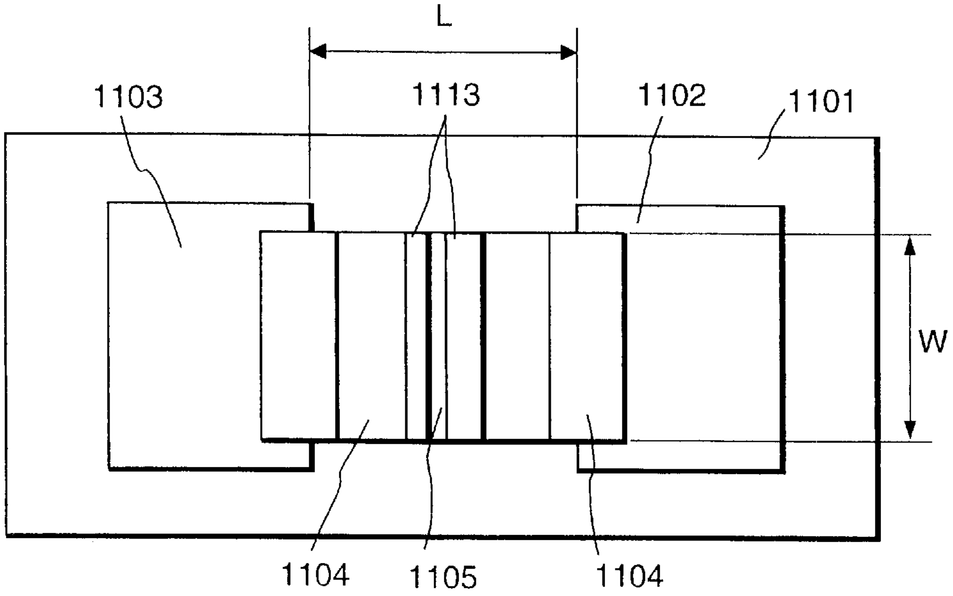
FIGS. 6A and 6B are a plan view and a sectional view, respectively, showing a flat surface-conduction emission type emitting device used in the embodiment.
Figure 6B:
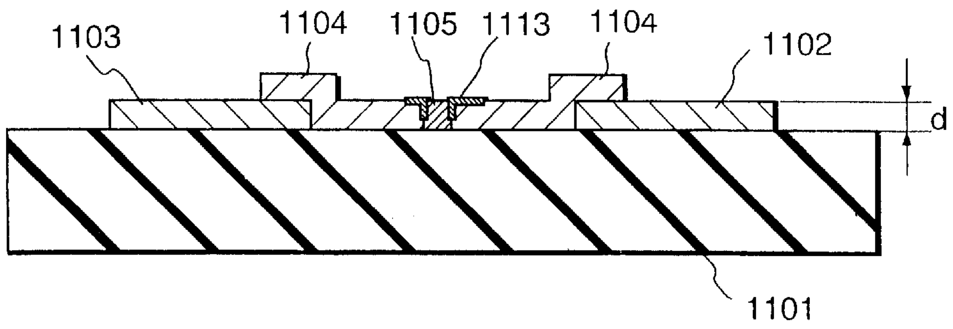

FIGS. 6A and 6B are a plan view and a sectional view, respectively, for explaining the structure of the flat surface-conduction emission type emitting device.

Referring to FIGS. 6A and 6B, reference numeral 1101 denotes a substrate; numerals 1102 and 1103 denote device electrodes; numeral 1104 denotes a conductive thin film; numeral 1105 denotes an electron-emitting portion formed by the forming processing; and numeral 1113 denotes a thin film formed by the activation processing.

As the substrate 1101, various glass substrates of, e.g., quartz glass and soda-lime glass, various ceramic substrates of, e.g., alumina, or any of those substrates with an insulating layer, e.g., $SiO_2$, formed thereon can be employed. The device electrodes 1102 and 1103, provided in parallel to the substrate 1101 and opposing to each other, comprise conductive material. For example, any material of metals such as Ni, Cr, Au, Mo, W, Pt, Ti, Cu, Pd and Ag, or alloys of these metals, otherwise metal oxides such as $In_2O_3$—$SnO_2$, or semiconductive material such as polysilicon, can be employed. These electrodes 1102 and 1103 can be easily formed by the combination of a film-forming technique such as vacuum-evaporation and a patterning technique such as photolithography or etching. However, any other method (e.g., printing technique) may be employed.

The shape of the electrodes 1102 and 1103 is appropriately designed in accordance with an application object of the electron-emitting device. Generally, an interval L between electrodes is designed by selecting an appropriate value in a range from hundreds of angstroms to hundreds of micrometers. A most preferable range for a display apparatus is from several micrometers to tens of micrometers. As for electrode thickness d, an appropriate value is in a range of hundreds of angstroms to several micrometers.

The conductive thin film 1104 comprises a fine particle film. The "fine particle film" is a film which contains a lot of fine particles (including masses of particles) as film-constituting members. In a microscopic view, normally individual particles exist in the film at predetermined intervals, or in adjacent to each other, or overlapped with each other. One particle has a diameter within a range from several angstroms to thousands of angstroms. Preferably, the diameter is within a range from 10 angstroms to 200 angstroms. The thickness of the film 1104 is appropriately set in consideration of conditions as follows. That is, a condition necessary for electrical connection to the device electrode 1102 or 1103, a condition for the forming processing to be described later, and a condition for setting electric resistance of the fine particle film itself to an appropriate value to be described later, etc.

Specifically, the thickness of the film is set in a range from several angstroms to thousands of angstroms, more preferably, 10 angstroms to 500 angstroms.

Materials used for forming the fine particle film are, e.g., metals such as Pd, Pt, Ru, Ag, Au, Ti, In, Cu, Cr, Fe, Zn, Sn, Ta, W and Pb, oxides such as PdO, $Sno_2$, $In_2O_3$, PbO and $Sb_2O_3$, borides such as $HfB_2$, $ZrB_2$, $LaB_6$, $CeB_6$, $YB_4$ and $GdB_4$, carbide such as TiC, ZrC, HfC, TaC, SiC, WC, nitrides such as TiN, ZrN and HfN, semiconductors such as Si and Ge, and carbons. Any of these appropriate material(s) can be appropriately selected.

As described above, the conductive thin film 1104 is formed with a fine particle film, and a sheet resistance of the film is set to reside within a range from $10^3$ to $10^7$ (Ω/sq).

As it is preferable that the conductive thin film 1104 is electrically connected to the device electrodes 1102 and 1103, they are arranged so as to overlap with each other at one portion. In FIG. 6B, the respective parts are overlapped in order of, the substrate 1101, the device electrodes 1102 and 1103, and the conductive thin film 1104, from the bottom. This overlapping order may be, the substrate, the conductive thin film, and the device electrodes, from the bottom.

The electron-emitting portion 1105 is a fissured portion formed at a part of the conductive thin film 1104. The electron-emitting portion 1105 has a resistance characteristic higher than peripheral conductive thin film. The fissure is formed by the forming processing, to be described later on, the conductive thin film 1104. In some cases, particles, having a diameter of several angstroms to hundreds of angstroms, are arranged within the fissured portion. As it is difficult to exactly illustrate actual position and shape of the electron-emitting portion, therefore, FIGS. 6A and 6B show the fissured portion schematically.

The thin film 1113, which comprises carbon or carbon compound material, covers the electron-emitting portion 1105 and its peripheral portion. The thin film 1113 is formed by the activation processing to be described later after the forming processing.

The thin film 1113 is preferably graphite monocrystalline, graphite polycrystalline, amorphous carbon, or mixture thereof, and its thickness is 500 angstroms or less, more preferably, 300 angstroms or less.

As it is difficult to exactly illustrate actual position or shape of the thin film 1113, FIGS. 6A and 6B show the film schematically. FIG. 6A shows the device where a part of the thin film 1113 is removed.

The preferred basic structure of the surface-conduction emission type emitting device is as described above. In the embodiment, the device has the following constituents.

That is, the substrate 1101 comprises a soda-lime glass, and the device electrodes 1102 and 1103, an Ni thin film. The electrode thickness d is 1000 angstroms and the electrode interval L is 2 $\mu$m.

The main material of the fine particle film is Pd or PdO. The thickness of the fine particle film is about 100 angstroms, and its width W is 100 $\mu$m.

Next, a method of manufacturing a preferred flat surface-conduction emission type emitting device will be described with reference to FIGS. 7A to 7D which are sectional views showing the manufacturing processes of the surface-conduction emission type emitting device. Note that reference numerals are the same as those in FIGS. 6A and 6B.

Figure 7A:
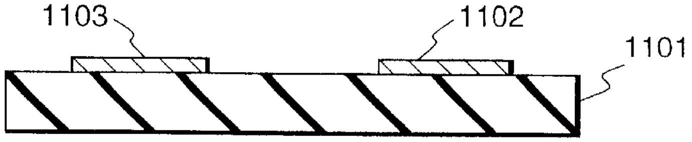
FIGS. 7A to 7E are sectional views showing the steps in manufacturing the flat surface-conduction emission type emitting device.

(1) First, as shown in FIG. 7A, the device electrodes 1102 and 1103 are formed on the substrate 1101. In forming the electrodes 1102 and 1103, first, the substrate 1101 is fully washed with a detergent, pure water and an organic solvent, then, material of the device electrodes is deposited there. As a depositing method, a vacuum film-forming technique such as evaporation and sputtering may be used. Thereafter, patterning using a photolithography etching technique is performed on the deposited electrode material. Thus, the pair of device electrodes 1102 and 1103 are formed.

Figure 7B:
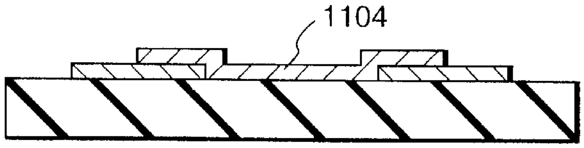

(2) Next, as shown in FIG. 7B, the conductive thin film 1104 is formed.

In forming the conductive thin film, first, an organic metal solvent is applied to the substrate in FIG. 7A, then the applied solvent is dried and sintered, thus forming a fine particle film. Thereafter, the fine particle film is patterned into a predetermined shape by the photolithography etching method. The organic metal solvent means a solvent of organic metal compound containing material of minute particles, used for forming the conductive thin film, as a main component, i.e., Pd in this embodiment. In the embodiment, application of organic metal solvent is made by dipping, however, any other method such as a spinner method and spraying method may be employed.

As a film-forming method of the conductive thin film made with the minute particles, the application of organic metal solvent used in the embodiment can be replaced with any other method such as a vacuum evaporation method, a sputtering method or a chemical vapor-phase accumulation method.

Figure 7C:
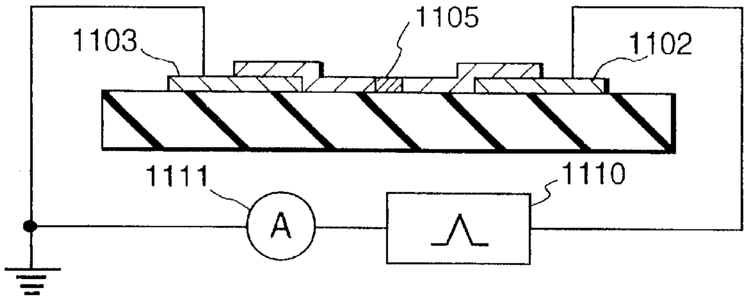

(3) Then, as shown in FIG. 7C, appropriate voltage is applied between the device electrodes 1102 and 1103, from a power source 1110 for the forming processing, then the forming processing is performed, thus forming the electron-emitting portion 1105. The forming processing here is electric energization of a conductive thin film 1104 (FIG. 7B) formed of a fine particle film, to appropriately destroy, deform, or deteriorate a part of the conductive thin film, thus changing the film to have a structure suitable for electron emission. In the conductive thin film, the portion changed for electron emission (i.e., electron-emitting portion 1105) has an appropriate fissure in the thin film. Comparing the thin film 1104 having the electron-emitting portion 1105 with the thin film before the forming processing, the electric resistance measured between the device electrodes 1102 and 1103 has greatly increased.

Figure 8:
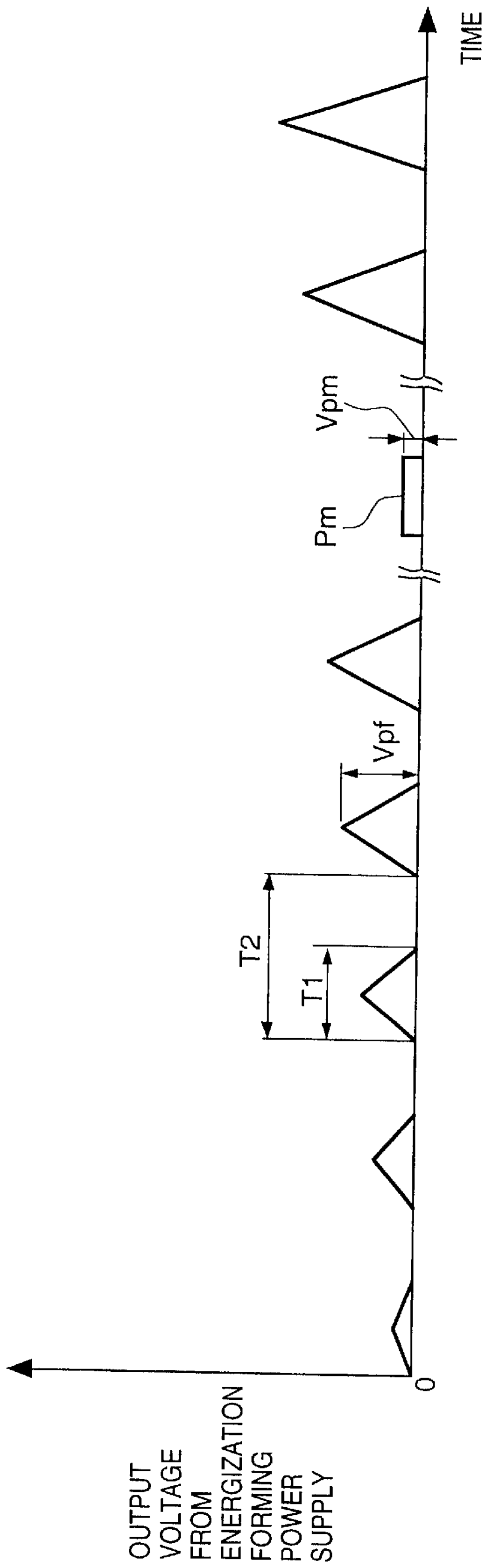
FIG. 8 is a graph showing the waveform of an application voltage in forming processing.

The electrification method in the forming processing will be explained in more detail with reference to FIG. 8 showing an example of waveform of appropriate voltage applied from the forming power source 1110.

Preferably, in case of forming a conductive thin film of a fine particle film, a pulse-form voltage is employed. In this embodiment, as shown in FIG. 8, a triangular-wave pulse having a pulse width T1 is continuously applied at a pulse interval of T2. Upon application, a wave peak value Vpf of the triangular-wave pulse is sequentially increased. Further, a monitor pulse Pm to monitor status of forming the electron-emitting portion 1105 is inserted between the triangular-wave pulses at appropriate intervals, and current that flows at the insertion is measured by a galvanometer 1111.

In this embodiment, in $10^{-5}$ Torr vacuum atmosphere, the pulse width T1 is set to 1 msec; and the pulse interval T2, to 10 msec. The wave peak value Vpf is increased by 0.1 V, at each pulse. Each time the triangular-wave has been applied for five pulses, the monitor pulse Pm is inserted. To avoid ill-effecting the forming processing, a voltage Vpm of the monitor pulse is set to 0.1 V. When the electric resistance between the device electrodes 1102 and 1103 becomes $1\times10^{6}$ Ω, i.e., the current measured by the galvanometer 1111 upon application of monitor pulse becomes $1\times10^{-7}$ A or less, the electrification of the forming processing is terminated.

Note that the above processing method is preferable to the surface-conduction emission type emitting device of this embodiment. In case of changing the design of the surface-conduction emission type emitting device concerning, e.g., the material or thickness of the fine particle film, or the device electrode interval L, the conditions for electrification are preferably changed in accordance with the change of device design.

Figure 7D:
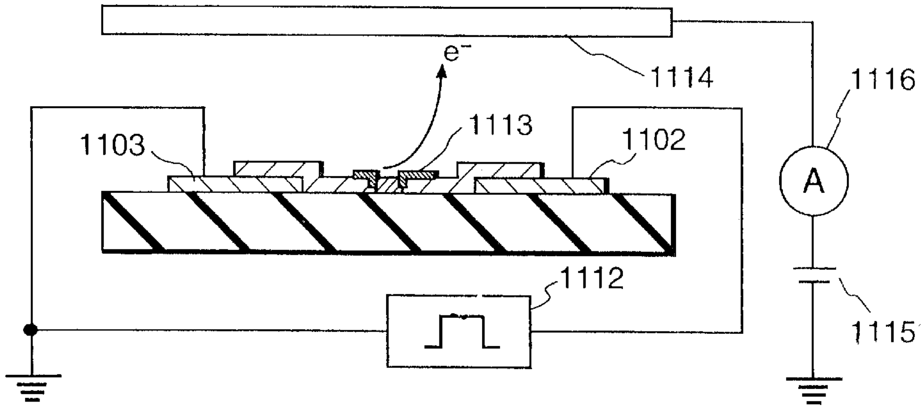

(4) Next, as shown in FIG. 7D, appropriate voltage is applied, from an activation power source 1112, between the device electrodes 1102 and 1103, and the activation processing is performed to improve electron-emitting characteristics. The activation processing here is electrification of the electron-emitting portion 1105 (FIG. 7C), formed by the forming processing, on appropriate condition(s), for depositing carbon or carbon compound around the electron-emitting portion 1105 (In FIG. 7D, the deposited material of carbon or a carbon compound is schematically shown as material 1113). Comparing the electron-emitting portion 1105 with that before the activation processing, the emission current at the same applied voltage has become, typically, 100 times or greater.

The activation is made by periodically applying a voltage pulse in $10^{-2}$ or $10^{-5}$ Torr vacuum atmosphere, to accumulate carbon or carbon compound mainly derived from organic compound(s) existing in the vacuum atmosphere. The accumulated material 1113 is any of graphite monocrystalline, graphite polycrystalline, amorphous carbon or mixture thereof. The thickness of the accumulated material 1113 is 500 angstroms or less, more preferably, 300 angstroms or less.

Figure 9A:
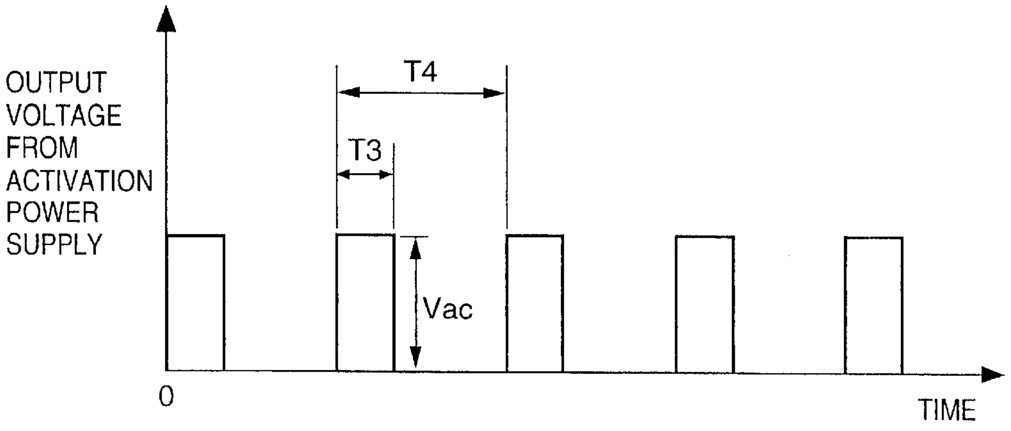
FIGS. 9A and 9B are graphs respectively, showing the waveform of an application voltage in activation processing, and a change in emission current Ie in the activation processing.

The electrification method in this activation processing will be described in more detail with reference to FIG. 9A showing an example of a waveform of an appropriate voltage applied from the activation power source 1112. In this example, a rectangular-wave voltage Vac is set to 14 V; a pulse width T3, to 1 msec; and a pulse interval T4, to 10 msec. Note that the above electrification conditions are preferable for the surface-conduction emission type emitting device of the embodiment. In a case where the design of the surface-conduction emission type emitting device is changed, the electrification conditions are preferably changed in accordance with the change of device design.

Figure 9B:
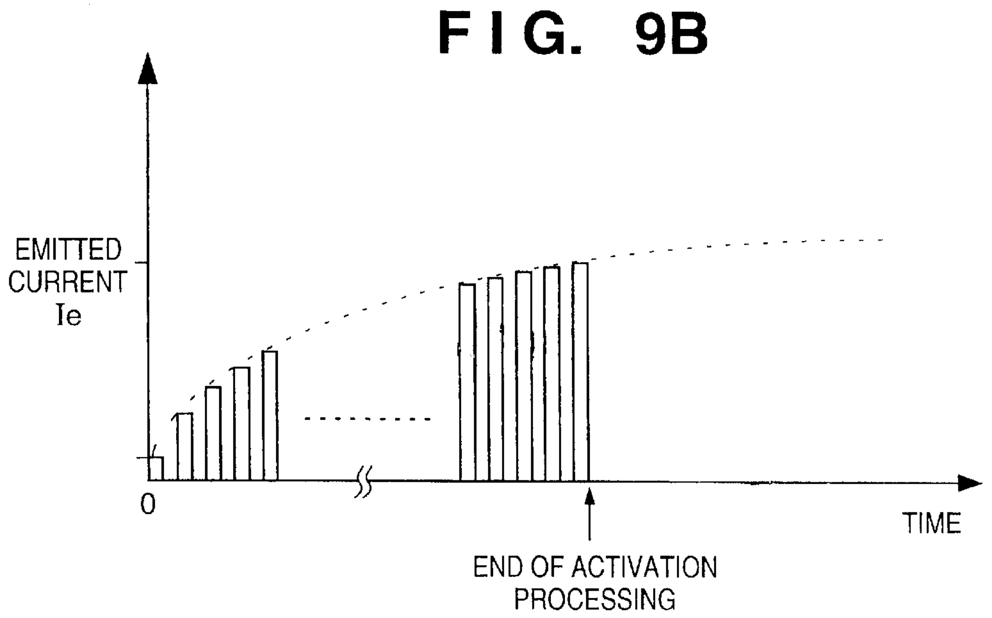

In FIG. 7D, reference numeral 1114 denotes an anode electrode, connected to a direct-current (DC) high-voltage power source 1115 and a galvanometer 1116, for capturing emission current Ie emitted from the surface-conduction emission type emitting device. In a case where the substrate 1101 is incorporated into the display panel before the activation processing, the Al layer on the fluorescent surface of the display panel is used as the anode electrode 1114. While applying voltage from the activation power source 1112, the galvanometer 1116 measures the emission current Ie, thus monitors the progress of activation processing, to control the operation of the activation power source 1112. FIG. 9B shows an example of the emission current Ie measured by the galvanometer 1116.

As application of pulse voltage from the activation power source 1112 is started in this manner, the emission current Ie increases with elapse of time, gradually comes into saturation, and almost never increases then. At the substantial saturation point, the voltage application from the activation power source 1112 is stopped, then the activation processing is terminated.

Note that the above electrification conditions are preferable to the surface-conduction emission type emitting device of the embodiment. In case of changing the design of the surface-conduction emission type emitting device, the conditions are preferably changed in accordance with the change of device design.

Figure 7E:
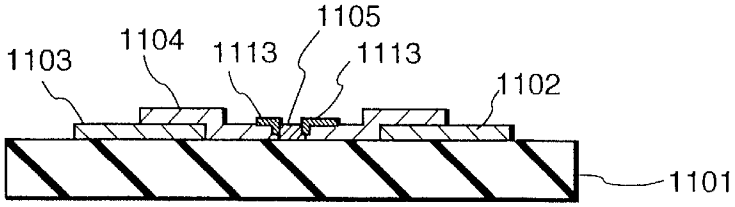

As described above, the surface-conduction emission type emitting device as shown in FIG. 7E is manufactured.

(Step Surface-Conduction emission type emitting Device)

Next, another typical structure of the surface-conduction emission type emitting device where an electron-emitting portion or its peripheral portion is formed of a fine particle film, i.e., a stepped surface-conduction emission type emitting device will be described.

Figure 10:
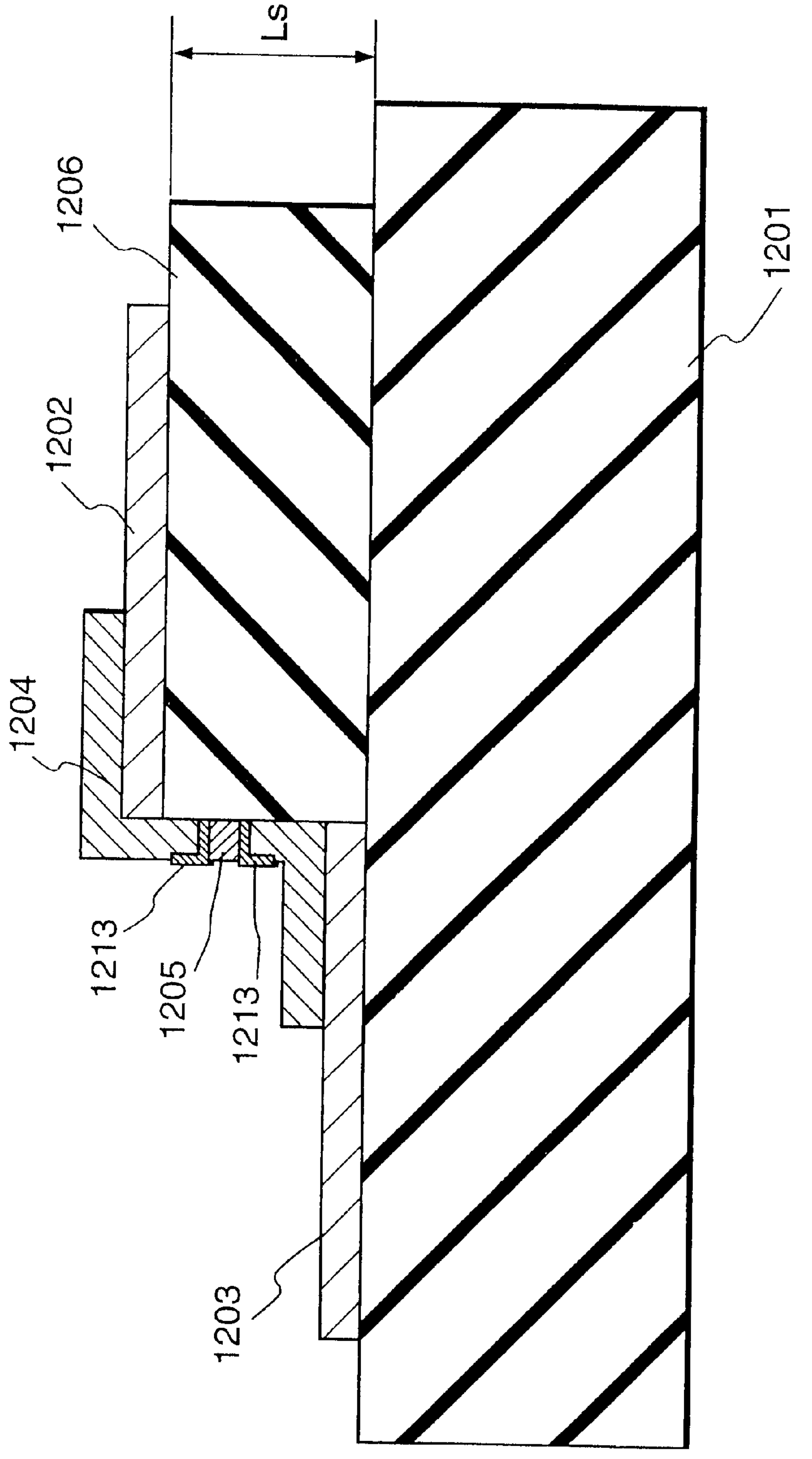
FIG. 10 is a sectional view showing a step surface-conduction emission type emitting device used in the embodiment.

FIG. 10 is a sectional view schematically showing the basic construction of the step surface-conduction emission type emitting device.

Referring to FIG. 10, reference numeral 1201 denotes a substrate; numerals 1202 and 1203 denote device electrodes; numeral 1206 denotes a step-forming member for making height difference between the electrodes 1202 and 1203; numeral 1204 denotes a conductive thin film using a fine particle film; numeral 1205 denotes an electron-emitting portion formed by the forming processing; and numeral 1213 denotes a thin film formed by the activation processing.

A difference between the step surface-conduction emission type emitting device from that of the above-described flat electron-emitting device structure is that one of the device electrodes (1202 in this example) is provided on the step-forming member 1206 and the conductive thin film 1204 covers the side surface of the step-forming member 1206. The device interval L in FIGS. 6A and 6B is set in this structure as a height difference Ls corresponding to the height of the step-forming member 1206. Note that the substrate 1201, the device electrodes 1202 and 1203, the conductive thin film 1204 using the fine particle film can comprise the materials given in the explanation of the flat surface-conduction emission type emitting device. Further, the step-forming member 1206 comprises electrically insulating material such as $SiO_2$.

Next, a method of manufacturing the stepped surface-conduction emission type emitting device will be described with reference FIGS. 11A to 11F which are sectional views showing the manufacturing processes. In these figures, reference numerals of the respective parts are the same as those in FIG. 10.

Figure 11A:
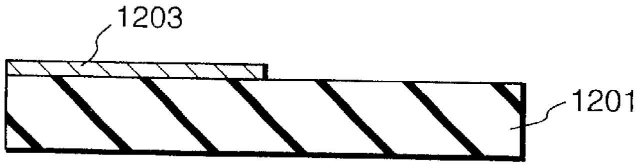
FIGS. 11A to 11F are sectional views showing the steps in manufacturing the step surface-conduction emission type emitting device.

(1) First, as shown in FIG. 11A, the device electrode 1203 is formed on the substrate 1201.

Figure 11B:
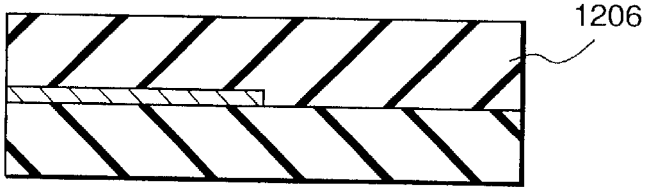

(2) Next, as shown in FIG. 11B, the insulating layer 1206 for forming the step-forming member is deposited. The insulating layer may be formed by accumulating, e.g., $SiO_2$ by a sputtering method, however, the insulating layer may be formed by a film-forming method such as a vacuum evaporation method or a printing method.

Figure 11C:
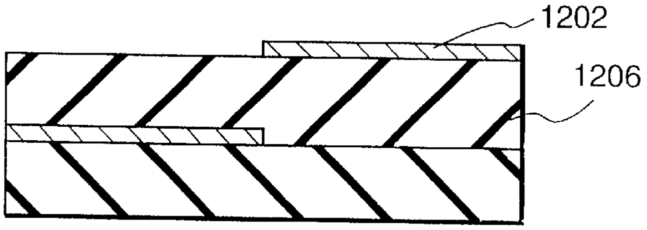

(3) Next, as shown in FIG. 11C, the device electrode 1202 is formed on the insulating layer 1206.

Figure 11D:
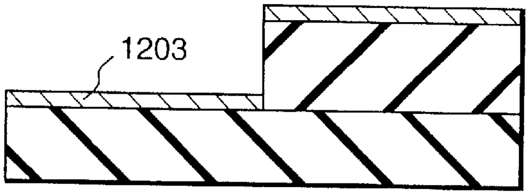

(4) Next, as shown in FIG. 11D, a part of the insulating layer 1206 (FIG. 11C) is removed by using, e.g., an etching method, to expose the device electrode 1203.

Figure 11E:
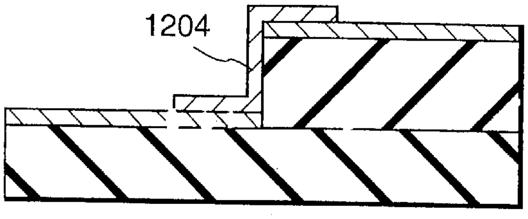

(5) Next, as shown in FIG. 11E, the conductive thin film 1204 using the fine particle film is formed. Upon formation, similar to the above-described flat device structure, a film-forming technique such as an applying method is used.

(6) Next, similar to the flat device structure, the forming processing is performed to form the electron-emitting portion 1205. (The forming processing similar to that explained using FIG. 7C may be performed).

(7) Next, similar to the flat device structure, the activation processing is performed to deposit carbon or carbon compound around the electron-emitting portion.

(Activation processing similar to that explained using FIG. 7D may be performed).

Figure 11F:
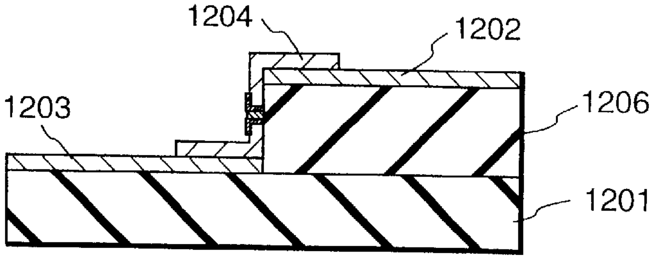

As described above, the stepped surface-conduction emission type emitting device shown in FIG. 11F is manufactured.

(Characteristic of Surface-Conduction emission type emitting Device Used in Display Apparatus)

The structure and manufacturing method of the flat surface-conduction emission type emitting device and those of the stepped surface-conduction emission type emitting device are as described above. Next, the characteristic of the electron-emitting device used in the display apparatus will be described below.

Figure 12:
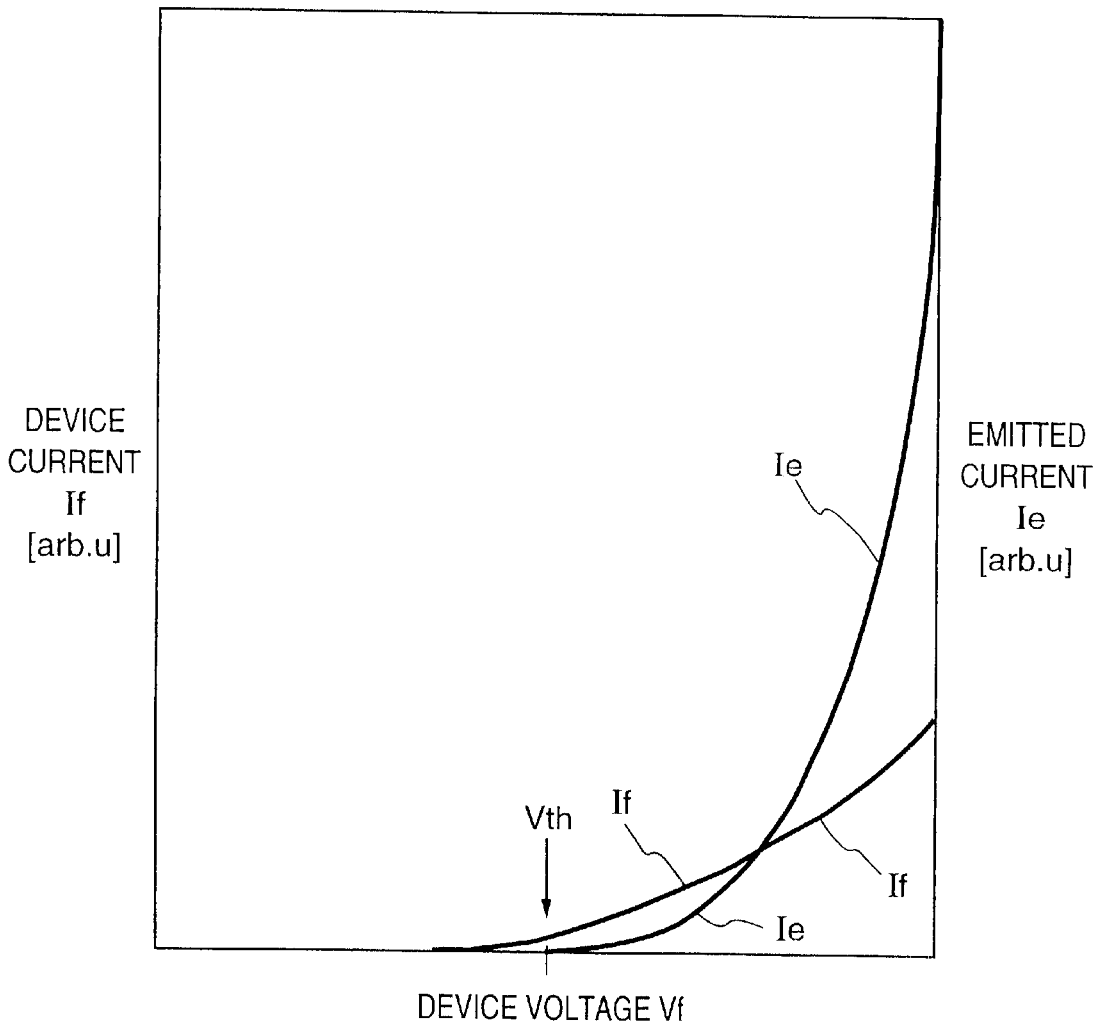
FIG. 12 is a graph showing the typical characteristics of the surface-conduction emission type emitting device used in the embodiment.

FIG. 12 shows a typical example of (emission current Ie) to (device voltage (i.e., voltage to be applied to the device) Vf) characteristic and (device current If) to (device application voltage Vf) characteristic of the device used in the display apparatus of this embodiment. Note that compared with the device current If, the emission current Ie is very small, therefore it is difficult to illustrate the emission current Ie by the same measure of that for the device current If. In addition, these characteristics change due to change of designing parameters such as the size or shape of the device. For these reasons, two lines in the graph of FIG. 12 are respectively given in arbitrary units.

Regarding the emission current Ie, the device used in the display apparatus has three characteristics as follows.

First, when voltage of a predetermined level (referred to as "threshold voltage Vth") or greater is applied to the device, the emission current Ie drastically increases, however, with voltage lower than the threshold voltage Vth, almost no emission current Ie is detected. That is, regarding the emission current Ie, the device has a nonlinear characteristic based on the clear threshold voltage Vth.

Second, the emission current Ie changes in dependence upon the device application voltage Vf. Accordingly, the emission current Ie can be controlled by changing the device voltage Vf.

Third, the emission current Ie is output quickly in response to application of the device voltage Vf to the surface-conduction emission type emitting device. Accordingly, an electrical charge amount of electrons to be emitted from the device can be controlled by changing a period of application of the device voltage Vf.

The surface-conduction emission type emitting device with the above three characteristics is preferably applied to the display apparatus. For example, in a display apparatus having a large number of devices provided corresponding to the number of pixels of a display screen, if the first characteristic is utilized, display by sequential scanning of the display screen is possible. This means that the threshold voltage Vth or greater is appropriately applied to a driven device, while voltage lower than the threshold voltage Vth is applied to an unselected device. In this manner, sequentially changing the driven devices enables display by sequential scanning of the display screen.

Further, emission luminance can be controlled by utilizing the second or third characteristic, which enables multi-gradation display.

Figure 13:
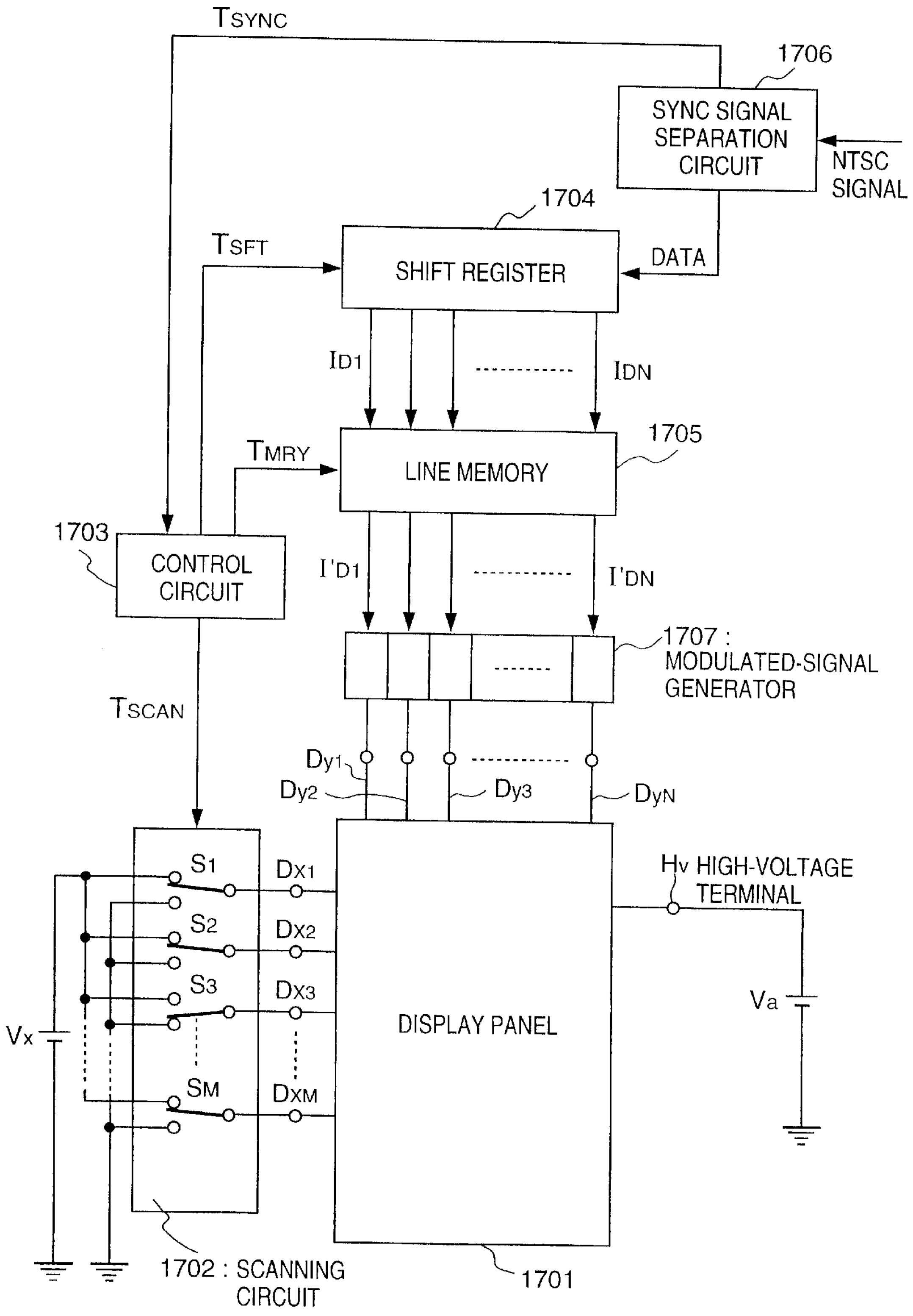
FIG. 13 is a block diagram showing the schematic arrangement of a driving circuit for the image display apparatus according to the embodiment of the present invention.
Figure 14A:
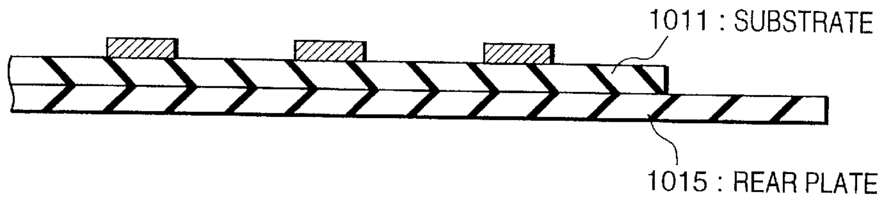
FIGS. 14A to 14D are views showing examples of the sequence of assembling the display panel in the embodiment.
Figure 14B:
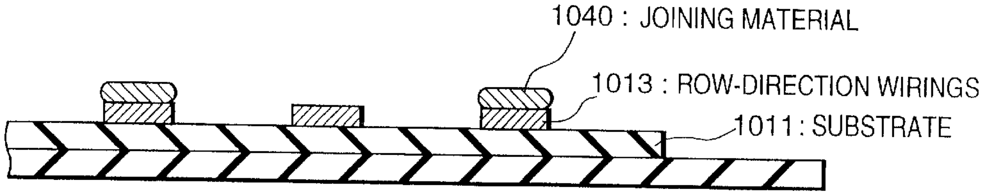
Figure 14C:
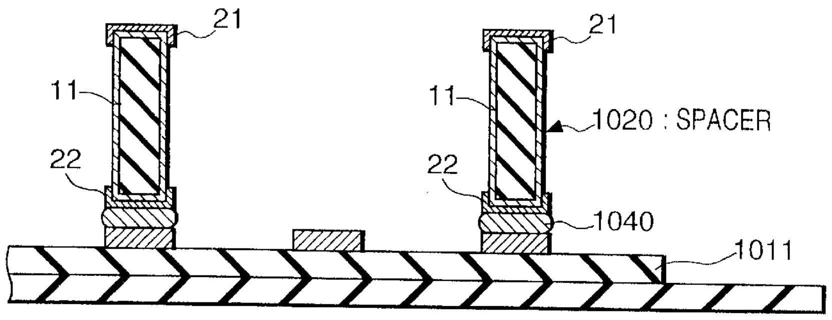
Figure 14D:
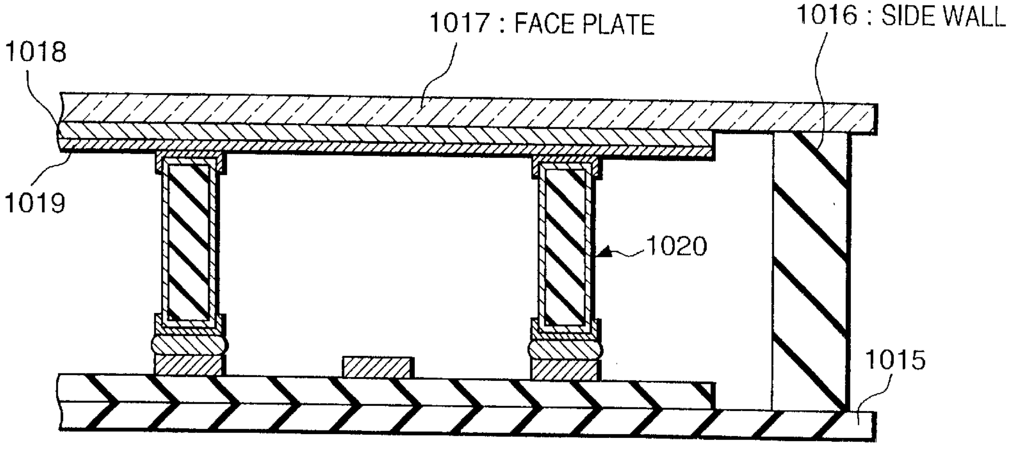
Figure 15:
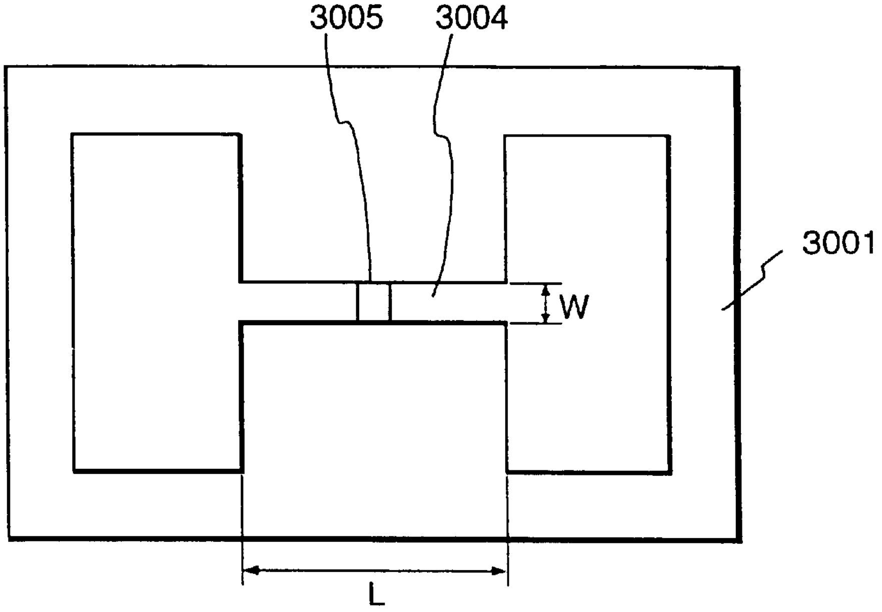
FIG. 15 PRIOR ART
FIG. 15 is a plan view showing an example of a conventionally known surface-conduction emission type emitting device.
Figure 16:
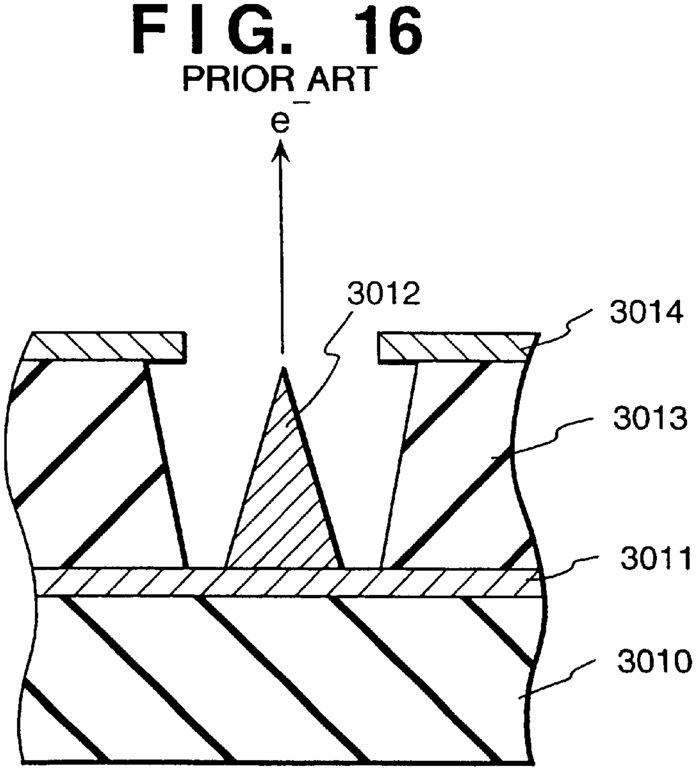
FIG. 16 PRIOR ART
FIG. 16 is a sectional view showing an example of a conventionally known FE type device.
Figure 17:
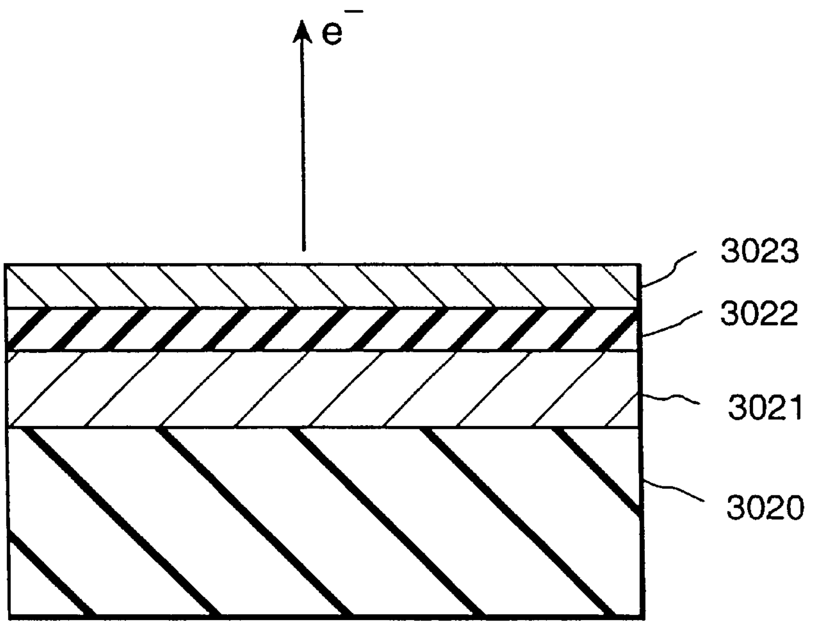
FIG. 17 PRIOR ART
FIG. 17 is a sectional view showing an example of a conventionally known MIN type device.

FIG. 13 is a block diagram showing the schematic arrangement of a driving circuit for performing television display on the basis of a television signal of the NTSC scheme. Referring to FIG. 13, a display panel 1701 corresponds to the display panel described above. This panel is manufactured and operates in the same manner described above. A scanning circuit 1702 scans display lines. A control circuit 1703 generates signals and the like to be input to the scanning circuit 1702. A shift register 1704 shifts data in units of lines. A line memory 1705 inputs 1-line data from the shift register 1704 to a modulated signal generator 1707. A sync signal separation circuit 1706 separates a sync signal from an NTSC signal.

The function of each component in FIG. 13 will be described in detail below.

The display panel 1701 is connected to an external electric circuit through terminals Dx1 to DxM and Dy1 to DyN and a high-voltage terminal Hv. Scanning signals for sequentially driving the multi-electron source in the display panel 1701, i.e., the cold cathode devices wired in a M×N matrix in units of lines (in units of N devices) are applied to the terminals Dx1 to DxM. Modulated signals for controlling the electron beams output from N devices corresponding to one line, which are selected by the above scanning signals, are applied to the terminals Dy1 to DyN. For example, a DC voltage of 5 kV is applied from a DC voltage source Va to the high-voltage terminal Hv. This voltage is an accelerating voltage for giving energy enough to excite the fluorescent substances to the electron beams output from the multi-electron source.

The scanning circuit 1702 will be described next. This circuit incorporates M switching elements (denoted by reference symbols S1 to SM in FIG. 13). Each switching element serves to select either an output voltage from a DC voltage source Vx or OV (ground level) and is electrically connected to a corresponding one of the terminals Dx1 to DxM of the display panel 1701. The switching elements S1 to SM operate on the basis of a control signal TSCAN output from the control circuit 1703. In practice, this circuit can be easily formed in combination with switching elements such as FETs. The DC voltage source Vx is set on the basis of the characteristics of the cold cathode device in FIG. 12 to output a constant voltage such that the driving voltage to be applied to a device which is not scanned is set to an electron emission threshold voltage Vth or lower.

The control circuit 1703 serves to match the operations of the respective components with each other to perform proper display on the basis of an externally input image signal. The control circuit 1703 generates control signals TSCAN, TSFT, and TMRY for the respective components on the basis of a sync signal TSYNC sent from the sync signal separation circuit 1706 to be described next. The sync signal separation circuit 1706 is a circuit for separating a sync signal component and a luminance signal component from an externally input NTSC television signal. As is known well, this circuit can be easily formed by using a frequency separation (filter) circuit. The sync signal separated by the sync signal separation circuit 1706 is constituted by vertical and horizontal sync signals, as is known well. In this case, for the sake of descriptive convenience, the sync signal is shown as the signal TSYNC. The luminance signal component of an image, which is separated from the television signal, is expressed as a signal DATA for the sake of descriptive convenience. This signal is input to the shift register 1704.

The shift register 1704 performs serial/parallel conversion of the signal DATA, which is serially input in a time-series manner, in units of lines of an image. The shift register 1704 operates on the basis of the control signal TSFT sent from the control circuit 1703. In other words, the control signal TSFT is a shift clock for the shift register 1704. One-line data (corresponding to driving data for n electron-emitting devices) obtained by serial/parallel conversion is output as N signals ID1 to IDN from the shift register 1704.

The line memory 1705 is a memory for storing 1-line data for a required period of time. The line memory 1705 properly stores the contents of the signals ID1 to IDN in accordance with the control signal TMRY sent from the control circuit 1703. The stored contents are output as data I'D1 to I'DN to be input to the modulated signal generator 1707.

The modulated signal generator 1707 is a signal source for performing proper driving/modulation with respect to each electron-emitting device 1012 in accordance with each of the image data I'D1 to I'DN. Output signals from the modulated signal generator 1707 are applied to the electron-emitting devices 1012 in the display panel 1701 through the terminals Dy1 to DyN.

As described above, the surface-conduction emission type emitting device according to this embodiment has the following basic characteristics with respect to an emission current Ie, as described above with reference to FIG. 12. A clear threshold voltage Vth (8 V in the surface-conduction emission type emitting device of the embodiment) is set for electron emission. Each device emits electrons only when a voltage equal to or higher than the threshold voltage Vth is applied. In addition, the emission current Ie changes with a change in voltage equal to or higher than the electron emission threshold voltage Vth, as indicated by the graph of FIG. 12. Obviously, when a pulse-like voltage is to applied to this device, no electrons are emitted if the voltage is lower than the electron emission threshold voltage Vth. If, however, the voltage is equal to or higher than the electron emission threshold voltage Vth, the surface-conduction emission type emitting device emits an electron beam. In this case, the intensity of the output electron beam can be controlled by changing a peak value Vm of the pulse. In addition, the total amount of electron beam charges output from the device can be controlled by changing a width Pw of the pulse.

As a scheme of modulating an output from each electron-emitting device in accordance with an input signal, therefore, a voltage modulation scheme, a pulse width modulation scheme, or the like can be used. In executing the voltage modulation scheme, a voltage modulation circuit for generating a voltage pulse with a constant length and modulating the peak value of the pulse in accordance with input data can be used as the modulated signal generator 1707. In executing the pulse width modulation scheme, a pulse width modulation circuit for generating a voltage pulse with a constant peak value and modulating the width of the voltage pulse in accordance with input data can be used as the modulated signal generator 1707.

As the shift register 1704 and the line memory 1705 may be of the digital signal type or the analog signal type. That is, it suffices if an image signal is serial/parallel-converted and stored at predetermined speeds.

When the above components are of the digital signal type, the output signal DATA from the sync digital signal separation circuit 1706 must be converted into a digital signal. For this purpose, an A/D converter may be connected to the output terminal of the sync signal separation circuit 1706. Slightly different circuits are used for the modulated signal generator depending on whether the line memory 1705 outputs a digital or analog signal. More specifically, in the case of the voltage modulation scheme using a digital signal, for example, a D/A conversion circuit is used as the modulated signal generator 1707, and an amplification circuit and the like are added thereto, as needed. In the case of the pulse width modulation scheme, for example, a circuit constituted by a combination of a high-speed oscillator, a counter for counting the wave number of the signal output from the oscillator, and a comparator for comparing the output value from the counter with the output value from the memory is used as the modulated signal generator 1707. This circuit may include, as needed, an amplifier for amplifying the voltage of the pulse-width-modulated signal output from the comparator to the driving voltage for the electron-emitting device.

In the case of the voltage modulation scheme using an analog signal, for example, an amplification circuit using an operational amplifier and the like may be used as the modulated signal generator 1707, and a shift level circuit and the like may be added thereto, as needed. In the case of the pulse width modulation scheme, for example, a voltage-controlled oscillator (VCO) can be used, and an amplifier for amplifying an output from the oscillator to the driving voltage for the cold cathode device can be added thereto, as needed.

In the image display apparatus of this embodiment which can have one of the above arrangements, when voltages are applied to the respective cold cathode devices through the outer terminals Dx1 to DxM and Dy1 to DyN, electrons are emitted. A high voltage is applied to the metal back 1019 or the transparent electrode (not shown) through the high-voltage terminal Hv to accelerate the electron beams. The accelerated electrons collide with the fluorescent film 1018 to cause it to emit light, thereby forming an image.

The above arrangement of the image display apparatus is an example of an image forming apparatus to which the present invention can be applied. Various changes and modifications of this arrangement can be made within the spirit and scope of the present invention. Although a signal based on the NTSC scheme is used as an input signal, the input signal is not limited to this. For example, the PAL scheme and the SECAM scheme can be used. In addition, a TV signal (high-definition TV such as MUSE) scheme using a larger number of scanning lines than these schemes can be used.

The present invention will be further described below by referring to embodiments.

In each embodiment described below, a multi-electron source was formed by wiring N×M (N=3,072, M=1,024) surface-conduction emission type emitting devices, each having an electron-emitting portion at a conductive fine particle film between electrodes as described above, in a matrix using M row-direction wirings and N column-direction wirings (see FIGS. 1 and 4).

In this embodiment, the display panel shown in FIGS. 1 and 2 was manufactured.

First of all, a substrate 1011 on which row-direction wirings 1013, column-direction wirings 1014, inter-electrode insulating layers (not shown), and the device electrodes and conductive thin films of surface-conduction emission type emitting devices 1012 were formed in advance was fixed to a rear plate 1015 with a ceramic-based heat-resistant adhesive.

A joining material 1040 (line width: 250 μm) made of conductive frit glass containing conductive fine particles (conductive filler) having surfaces coated with gold or a conductive material such as a metal was applied onto the row-direction wirings 1013 (line width: 300 μm) on the substrate 1011 at equal intervals to be parallel to the row-direction wirings 1013.

Spacers 1020 (height: 5 mm, thickness: 200 μm, length: 20 mm), each having high-resistance films 11 (to be described later) formed on four surfaces, of the surfaces of each insulating member 1 made of soda-lime glass, which were exposed in the airtight container and low-resistance films 21 and 22 formed on abutment surfaces 3 and side surface portions 5, were arranged on the row-direction wiring 1013 (line width: 300 μm) on the substrate 1011 at equal intervals to be parallel to the row-direction wirings 1013 through the joining material 1040. The resultant structure was sintered at 400° C. to 500° C. in air for 10 min or more to bond and electrically connect the spacers to the row-direction wirings.

As the high-resistance film 11 of the spacer 1020, a Cr-Al alloy nitride film (thickness: 200 nm, resistance: about $10^9$ Ω/sq) formed by simultaneously sputtering Cr and Al targets using an RF power supply was used. As the low-resistance film 21, an Al film (thickness: 100 nm) was used.

A face plate 1017 having a fluorescent film 1018 constituted by striped primary color fluorescent substances extending in the column direction (Y direction) and a metal back 1019 formed on its inner surface was arranged 5 mm above the substrate 1011 by side walls 1016. The joining portions between the rear plate 1015 and the side walls 1016, and between the face plate 1017 and the side walls 1016, were coated with frit glass (not shown). The resultant structure was sintered at 400° C. to 500° C. in air for 10 min or more to seal the components.

The airtight container completed in the above process was evacuated by a vacuum pump through an exhaust pipe (not shown) to attain a sufficient vacuum. Thereafter, power was supplied to the respective devices through the outer terminals Dx1 to DxM and Dy1 to DyN, the row-direction wirings 1013, and the column-direction wirings 1014 to perform the above forming processing and activation processing, thereby manufacturing a multi-electron source.

The exhaust pipe (not shown) was heated and welded to seal the envelope (airtight container) in a vacuum of about $10^{-6}$ Torr using a gas burner.

Finally, gettering was performed to maintain the vacuum after sealing.

In the image display apparatus using the display panel completed in the above process and shown in FIGS. 1 and 2, scanning signals and modulated signals were applied from a signal generating means (not shown) to the respective cold cathode devices (surface-conduction emission type emitting devices) 1012 through the outer terminals Dx1 to DxM and Dy1 to DyN to cause the devices to emit electrons. A high voltage was applied to the metal back 1019 through the high-voltage terminal Hv to accelerate the emitted electron beams to cause the electrons to collide with the fluorescent film 1018. As a result, the fluorescent substances were excited to emit light, thereby displaying an image. Note that a voltage Va to be applied to the high-voltage terminal Hv was set to 3 kV to 10 kV, and a voltage Vf to be applied between each row-direction wiring 1013 and each column-direction wiring 1014 was set to 14 V.

In this case, emission spot rows were formed two-dimensionally at equal intervals, including emission spots formed by the electrons emitted by the cold cathode devices 1012 near the spacers 1020. As a result, a clear color image with good color reproduction characteristics could be displayed. This indicates that the formation of the spacers 1020 did not produce any electric field disturbance that affected the orbits of electrons.

Note that the multi-electron source in this embodiment can be an electron source having a ladder-like arrangement, which has a plurality of wirings connecting a plurality of parallel cold cathode devices through the two ends of each device (in the row direction) and controls electrons from the cold cathode devices by using control electrodes (grid) arranged above the cold cathode devices along a direction (column direction) perpendicular to the wirings.

The display panel of this embodiment is not limited to an image forming apparatus suitable for display. This display panel can also be used as a light-emitting source instead of the light-emitting diode of an optical printer made up of a photosensitive drum, the light-emitting diode, and the like.

In this case, by properly selecting M row-direction wires and N column-direction wires, the display panel can be applied as not only a linear light-emitting source but also a two-dimensional light-emitting source. In this case, the image forming member is not limited to the substance that directly emits light, like a fluorescent substance, used in the above embodiments. For example, a member on which a latent image is formed upon charging of electrons maybe used.

There can be provided an image forming apparatus capable of allowing vivid color reproduction free from brightness irregularity and color misregistration.

In addition, in assembling the image forming apparatus, positioning of the spacers in the apparatus can be facilitated.

As many apparently widely different embodiments of the present invention can be made without departing from the spirit and scope thereof, it is to be understood that the invention is not limited to the specific embodiments thereof except as defined in the appended claims.

What is claimed is:

1. An image forming apparatus, comprising:

an electron source having a plurality of electron-emitting devices wired by a plurality of wirings;

an image forming member, provided with black members extending in a predetermined direction and with florescent substances, that serves to form an image upon irradiation of electrons emitted by said electron source;

a member opposing said image forming member; and a rectangular spacers arranged between said image forming member and said member opposing said image forming member, wherein said rectangular spacer is bonded to said member opposing said image forming member via a joining material, and in contact with and not bonded to said image forming member with said joining material, and a longitudinal direction of said spacer crosses the predetermined direction of the black members, wherein said member opposing said image forming member includes one wiring of said plurality of wirings, and wherein said spacer is arranged along said wiring and has a low-resistance film along the longitudinal direction on an abutment surface that faces the wiring, said low-resistance film being electrically connected to the wiring.

2. The apparatus according to claim 1, wherein said member opposing said image forming member includes a substrate on which said plurality of electron-emitting devices are arranged, and said spacers are fixed on said substrate, on which said plurality of electron-emitting devices are arranged, at positions where electrons to be emitted by said electron source and irradiated on said image forming member are not blocked by said spacers.

3. The apparatus according to claim 1, wherein said plurality of electron-emitting devices are wired in a matrix through a plurality of row-direction wirings and a plurality of column-direction wirings, said member opposing said image forming member includes a substrate on which said plurality of electron-emitting devices are arranged, and said spacers are fixed on said row-direction wirings or said column-direction wirings.

4. The apparatus according to claim 1, wherein said spacers are fixed to said member opposing said image forming member by welding with the joining material.

5. The apparatus according to claim 1, wherein said electron-emitting devices are cold cathode devices.

6. The apparatus according to claim 5, wherein each of said cold cathode devices is a device including a conductive film having an electron-emitting portion between electrodes.

7. The apparatus according to claim 5, wherein each of said cold cathode devices is a surface-conduction emission type emitting device.

8. The apparatus according to claim 1, wherein said spacer is a spacer having conductivity.

9. The apparatus according to claim 8, wherein said spacer has a sheet resistance falling within a range of $10^5$ Ω/sq to $10^{12}$ Ω/sq.

10. The apparatus according to claim 8, wherein said plurality of electron-emitting devices are wired through wirings, said member opposing said image forming member includes a substrate on which said electron source is arranged, and said spacer is fixed on said wiring and is electrically connected thereto.

11. The apparatus according to claim 10, wherein said spacer is fixed to said wiring through a noble metal film.

12. The apparatus according to claim 10, wherein said spacer is fixed to said wiring by welding with a conductive joining material.

13. The apparatus according to claim 10, wherein said spacer is in contact with an acceleration electrode for accelerating electrons emitted by said electron-emitting devices arranged on said substrate and is electrically connected to said acceleration electrode.

14. The apparatus according to claim 13, wherein said spacer is fixed to said wiring through a noble metal film.

15. The apparatus according to claim 13, wherein said spacer is fixed to said wiring by welding with a conductive joining material.

16. The apparatus according to claim 8, wherein said plurality of electron-emitting devices are cold cathode devices.

17. The apparatus according to claim 16, wherein each of said cold cathode devices is a device including a conductive film having an electron-emitting portion between electrodes.

18. The apparatus according to claim 16, wherein each of said cold cathode devices is a surface-conduction emission type emitting device.

19. The apparatus according to claim 1, wherein each of the flourescence substances is shaped as a stripe.

20. The apparatus of according to claim 1, wherein each of the black members is shaped as a stripe.

21. The apparatus according to claim 1, wherein the black member is a black conductive member.

22. An image forming apparatus, comprising:

an electron source having a plurality of electron-emitting devices wired by a plurality of wirings;

an image forming member, provided with stripes of fluorescent substances, that serves to form an image upon irradiation of electrons emitted by said electron source;

a member opposing said image forming member; and a rectangular spacer arranged between said image forming member and said member opposing said image forming member, wherein said rectangular spacer is bonded to said member opposing said image forming member via a joining material, and in contact with and not bounded to said image forming member with said joining material, and a longitudinal direction of said spacer crosses the predetermined direction of the stripes of fluorescent substances, wherein said member opposing said image forming member includes one wiring of said plurality of wirings, and wherein said spacer is arranged along said wiring and has a low-resistance film along the longitudinal direction on an abutment surface that faces the wiring, said low-resistance film being electrically connected to the wiring.

23. The apparatus according to claim 1, wherein the stripes of fluorescent substances comprise stripes of fluorescent substances emitting light of different colors.

24. The apparatus according to claim 22, wherein said member opposing said image forming member includes a substrate on which said plurality of electron-emitting devices are arranged, and said spacers are fixed on said substrate, on which said plurality of electron-emitting devices are arranged, at positions where electrons to be emitted by said electron source and irradiated on said image forming member are not blocked by said spacers.

25. The apparatus according to claim 22, wherein said plurality of electron-emitting devices are wired in a matrix through a plurality of row-direction wirings and a plurality of column-direction wirings, and member opposing said image forming member includes a substrate on which said plurality of electron-emitting devices are arranged, and said spacers are fixed on said row-direction wirings or said column-direction wirings.

26. The apparatus according to claim 22, wherein said spacers are fixed to said member opposing said image forming member by welding with the joining material.

27. The apparatus according to claim 22, wherein said electron-emitting devices are cold cathode devices.

28. The apparatus according to claim 22, wherein said spacer is a spacer having conductivity.

29. The apparatus according to claim 28, wherein said plurality of electron-emitting devices are wired through wirings, said member opposing said image forming member includes a substrate on which said electron source is arranged, and said spacer is fixed on said wiring and is electrically connected thereto.

30. The apparatus according to claim 29, wherein said spacer is in contact with an acceleration electrode for accelerating electrons emitted by said electron-emitting devices arranged on said substrate and is electrically connected to said acceleration electrode.

31. The apparatus according to claim 1, wherein said spacer is arranged on said wiring.

32. The apparatus according to claim 22, wherein said spacer is arranged on said wiring.

* * * * *

UNITED STATES PATENT AND TRADEMARK OFFICE

CERTIFICATE OF CORRECTION

PATENT NO. : 6,522,064 B2
DATED : February 18, 2003
INVENTOR(S) : Hideaki Mitsutake et al.

It is certified that error appears in the above-identified patent and that said Letters Patent is hereby corrected as shown below:

Title page, Item [54] and Column 1, lines 1 and 2,
"IMAGE FORMING APPARATUS AND METHOD OF MANUFACTURE THE SAME" should read -- IMAGE FORMING APPARATUS AND METHOD OF MANUFACTURING THE SAME --.

Column 2,
Line 13, "Advance" should read -- Advances --.

Column 3,
Line 5, "an" should read -- a --.

Column 6,
Line 5, "an" should read -- a --; and
Line 16, "an" should read -- a --.

Column 7,
Line 61, "show" should read -- shows --.

Column 9,
Line 40, "ten" should read -- tens of --.

Column 11,
Line 45, "the surfaces, of" should read -- on --.

Column 13,
Line 57, "occurs" should read -- occur --.

Column 14,
Line 7, "constrains" should read -- constraints --.

Column 17,
Line 5, "later on," should read -- later, on --.

Column 23,
Line 29, "As the" should read -- The --.

UNITED STATES PATENT AND TRADEMARK OFFICE

CERTIFICATE OF CORRECTION

PATENT NO. : 6,522,064 B2 
DATED : February 18, 2003
INVENTOR(S) : Hideaki Mitsutake et al.

It is certified that error appears in the above-identified patent and that said Letters Patent is hereby corrected as shown below:

Column 25,
Line 61, "maybe" should read -- may be --.

Column 26,
Line 15, "spacers" should read -- spacer --.

Column 27,
Line 28, "flourescence" should read -- fluorescence --;
Line 29, "of" should be deleted; and
Line 47, "bounded" should read -- bonded --.

Signed and Sealed this

Sixteenth Day of September, 2003

JAMES E. ROGAN
*Director of the United States Patent and Trademark Office*